(12) United States Patent
Kawashima et al.

(10) Patent No.: US 8,481,990 B2
(45) Date of Patent: Jul. 9, 2013

(54) NONVOLATILE MEMORY ELEMENT

(75) Inventors: Yoshio Kawashima, Osaka (JP); Takumi Mikawa, Shiga (JP); Yukio Hayakawa, Kyoto (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 13/375,027

(22) PCT Filed: Mar. 7, 2011

(86) PCT No.: PCT/JP2011/001315
§ 371 (c)(1),
(2), (4) Date: Nov. 29, 2011

(87) PCT Pub. No.: WO2011/111361
PCT Pub. Date: Sep. 15, 2011

(65) Prior Publication Data
US 2012/0068148 A1 Mar. 22, 2012

(30) Foreign Application Priority Data
Mar. 8, 2010 (JP) .................. 2010-050249

(51) Int. Cl.
*H01L 47/00* (2006.01)
(52) U.S. Cl.
USPC ..... 257/4; 257/2; 257/3; 257/5; 257/E47.001; 438/99; 438/104; 438/382; 438/E21.004
(58) Field of Classification Search
USPC .................. 257/2–5, 295, 306; 438/99, 104, 438/382
See application file for complete search history.

(56) References Cited

U.S. PATENT DOCUMENTS

| | | |
|---|---|---|
| 6,611,014 B1 | 8/2003 | Kanaya et al. |
| 2004/0084701 A1 | 5/2004 | Kanaya et al. |
| 2007/0200158 A1 | 8/2007 | Genrikh et al. |

(Continued)

FOREIGN PATENT DOCUMENTS

| | | |
|---|---|---|
| JP | 2-110957 | 4/1990 |
| JP | 6-120358 | 4/1994 |

(Continued)

OTHER PUBLICATIONS

International Search Report issued May 31, 2011 in corresponding International Application No. PCT/JP2011/001315.

(Continued)

*Primary Examiner* — Dung A. Le
(74) *Attorney, Agent, or Firm* — Wenderoth, Lind & Ponack, L.L.P.

(57) ABSTRACT

A variable resistance nonvolatile memory element capable of suppressing a variation in resistance values is provided. A nonvolatile memory element according to the present invention includes: a silicon substrate (11); a lower electrode layer (102) formed on the silicon substrate (11); a variable resistance layer formed on the lower electrode layer (102); an upper electrode layer (104) formed on the variable resistance layer; a second interlayer insulating layer (19) formed to directly cover at least side surfaces of the lower electrode layer (102) and the variable resistance layer; a stress buffering region layer (105) for buffering a stress on the upper electrode layer (104), the stress buffering region layer being formed to directly cover at least an upper surface and side surfaces of the upper electrode layer (104) and comprising a material having a stress smaller than a stress of an insulating layer used as the second interlayer insulating layer (19); a second contact (16) extending to the upper electrode layer (104); and a wiring pattern (18) connected to the second contact (16).

14 Claims, 18 Drawing Sheets

U.S. PATENT DOCUMENTS

| | | |
|---|---|---|
| 2009/0102598 A1 | 4/2009 | Yamazaki et al. |
| 2009/0230378 A1 | 9/2009 | Ryoo et al. |
| 2009/0261315 A1 | 10/2009 | Toda et al. |
| 2009/0283736 A1 | 11/2009 | Kanzawa et al. |

FOREIGN PATENT DOCUMENTS

| | | |
|---|---|---|
| JP | 2002-280528 | 9/2002 |
| JP | 2007-27537 | 2/2007 |
| JP | 2007-235139 | 9/2007 |
| JP | 2008-192995 | 8/2008 |
| JP | 2008-218541 | 9/2008 |
| JP | 2009-124167 | 6/2009 |
| JP | 2009-218598 | 9/2009 |
| JP | 2009-260060 | 11/2009 |

OTHER PUBLICATIONS

J. McPherson et al., "Proposed Universal Relationship Between Dielectric Breakdown and Dielectric Constant", Electron Devices Meeting, 2002, pp. 633-636.

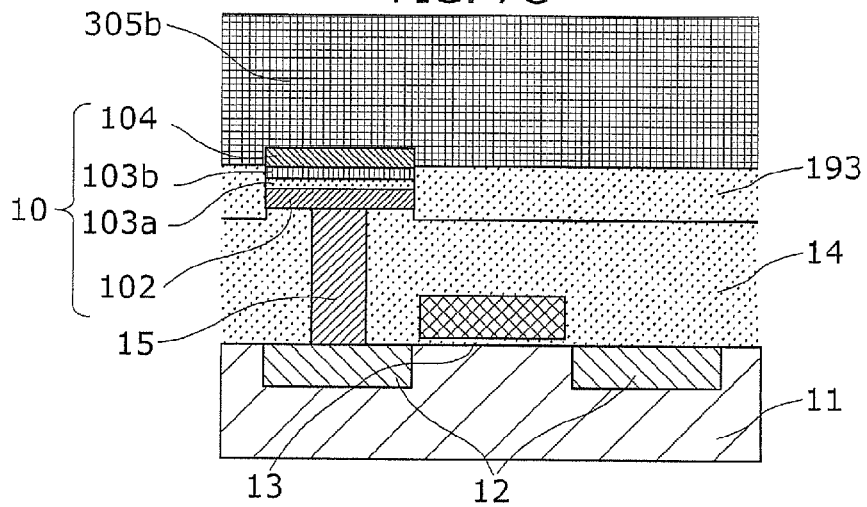
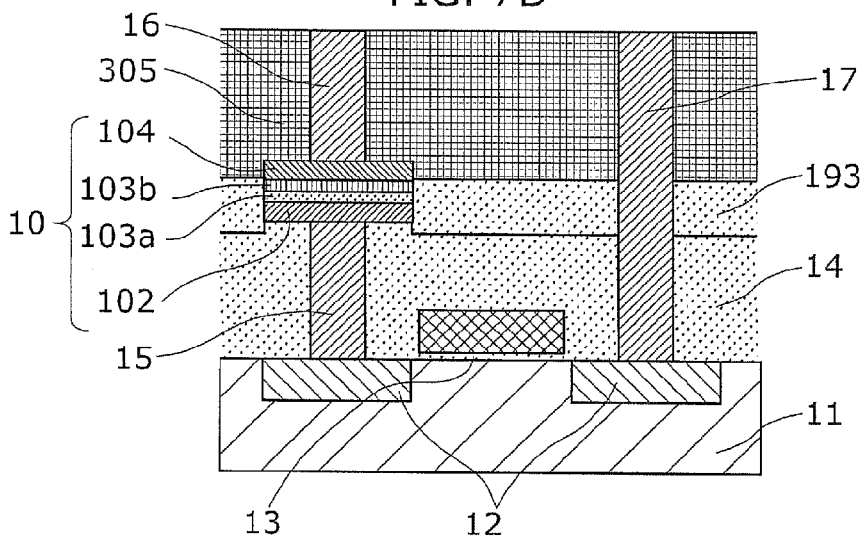
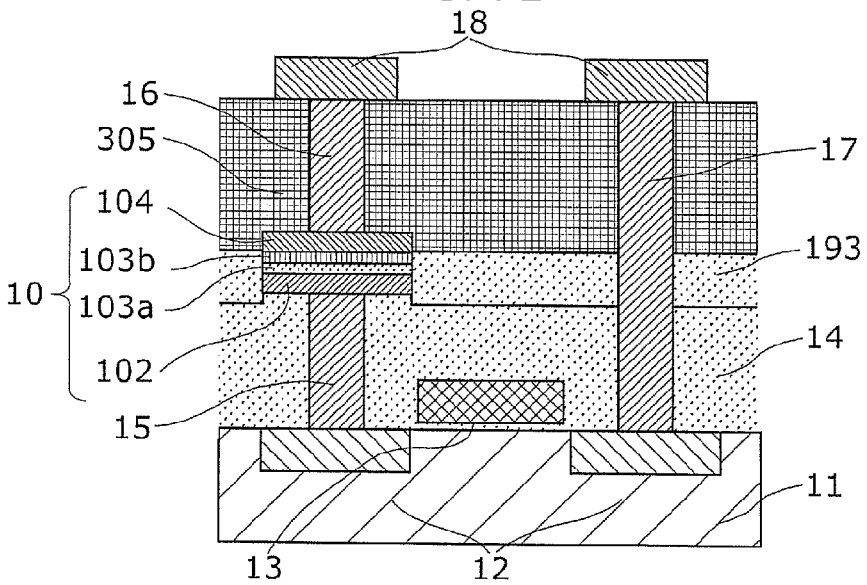

NONVOLATILE MEMORY ELEMENT

TECHNICAL FIELD

The present invention relates to a variable resistance nonvolatile memory element and a fabrication method for the variable resistance nonvolatile memory element.

BACKGROUND ART

In recent years, variable resistance nonvolatile memory elements using variable resistance material has been used as a material for storage. The variable resistance material comprises a transition metal oxide which is oxygen-deficient compared to a transition metal oxide in stoichiometric composition. Such a nonvolatile memory element includes an upper electrode layer, a lower electrode layer, a variable resistance layer interposed between the upper electrode layer and the lower electrode layer, and a resistance value of the variable resistance layer reversibly changes by applying an electric pulse between the upper electrode layer and the lower electrode layer. Accordingly, information can be stored in a nonvolatile manner by associating the information with the resistance value (for example, see Patent Literature 1). Compared to a flash memory element using floating gate, it is expected that the variable resistance nonvolatile memory element can be miniaturized, increase the speed, and reduce the power consumption.

CITATION LIST

Patent Literature

[Patent Literature 1] Japanese Unexamined Patent Application Publication No. 2007-235139

SUMMARY OF INVENTION

Technical Problem

However, in the conventional variable resistance nonvolatile memory element, there is a problem that the actual resistance values vary (variation for 340%), which is much higher than the variation in the resistance values (14%) estimated based on the thickness and composition of the variable resistance layer, electrodes and others, and the size of resist and the shape of resist after lithography, and the shape after dry etching.

The present invention has been conceived in view of this problem, and it is an object of the present invention to provide a variable resistance nonvolatile memory element capable of suppressing the variation in the resistance values, and the fabrication method for the variable resistance nonvolatile memory element.

Solution to Problem

In order to achieve the abovementioned object, the nonvolatile memory according to an aspect of the present invention includes: a substrate; a lower electrode layer formed on the substrate; a first variable resistance layer formed on the lower electrode layer and including a metal oxide; a second variable resistance layer formed on the first variable resistance layer and including a metal oxide having smaller oxygen deficiency than oxygen deficiency of the first variable resistance layer; an upper electrode layer formed on the second variable resistance layer; an interlayer insulating layer formed to cover at least side surfaces of the lower electrode layer, the first variable resistance layer, and the second variable resistance layer; a stress buffering region layer for buffering a stress on the upper electrode layer, the stress buffering region layer being formed to directly cover at least an upper surface and side surfaces of the upper electrode layer and including a material having a stress smaller than a stress of an insulating layer used as the interlayer insulating layer; a contact extending to the upper electrode layer; and a wiring pattern connected to the contact.

With this configuration, it is possible to implement a variable resistance nonvolatile memory element capable of suppressing the variation in the resistance values. More specifically, at least the stress applied from the interlayer insulating layer to the upper electrode layer due to the thermal treatment is buffered by the stress buffering region layer directly covering at least the upper surface and the side surfaces of the upper electrode layer. Thus, it is possible to reduce the stress from the interlayer insulating layer applied to the upper electrode layer. With this, it is possible to suppress the change in the form (formation of protrusion) of the upper electrode layer due to migration of the upper electrode layer, and to implement a high-quality nonvolatile memory without variation in the initial operation or operation characteristics of the resistance values.

This is because, through diligent research, the inventors found out that the cause of varied resistance values in the conventional configuration is due to the change in form (formation of protrusion) of the upper electrode layer due to stress migration. The following shall describe this point with reference to the drawings.

FIG. 12A is a cross-sectional drawing illustrating the configuration of the major part of the nonvolatile memory element according to a conventional example.

The nonvolatile memory element illustrated in FIG. 12A is fabricated by forming a variable resistance element 801 including: an upper electrode 802; a variable resistance layer 803; and a lower electrode 804, an interlayer insulating layer 819 surrounding the variable resistance element 801, and forming a contact 816 connected to the upper electrode 802 and a line 818. Here, the variable resistance layer 803 has a two-layered structure with a high resistance layer having a low oxygen deficiency and a low resistance layer having a high oxygen deficiency. In the variable resistance element 801, resistance changes at a proximity of an interface between the upper electrode 802 and a high resistance layer with low oxygen deficiency. The resistance values in FIG. 12B are measured by applying a voltage to the lower electrode 804 or the upper electrode 802 of the nonvolatile memory element fabricated as described above.

FIG. 12B is a graph illustrating initial resistance values of the nonvolatile memory element according to the conventional example illustrated in FIG. 12A.

The resistance distribution 1 in FIG. 12B illustrates initial resistance values of the nonvolatile memory element according to the conventional example. The resistance distribution 1 is a resistance distribution of the nonvolatile memory element fabricated by performing a 10-minute thermal treatment at the thermal treatment temperature of 400° C. twice after forming the interlayer insulating layer 819 using the conventional semiconductor process (once after planarizing the interlayer insulating layer 819, and once after the line 818 is formed). As illustrated in FIG. 12B, in the variation in the resistance distribution 1, 1σ is 340% with respect to the central value of the resistance values. The variation in the resistance distribution 1 is significantly larger than the variation in the form of the variable resistance element (1σ is 14%).

In contrast, the resistance distribution 2 in FIG. 12B is initial resistance values of the nonvolatile memory element according to the conventional example fabricated under a different condition from the fabrication condition of the resistance distribution 1. More specifically, the resistance distribution 2 is a resistance distribution of the nonvolatile memory element fabricated by performing the thermal treatment (thermal treatment temperature at 400° C. and treatment time for 10 minutes) only once after the line 818 is formed, without performing the thermal treatment (thermal treatment temperature at 400° C. and treatment time for 10 minutes) after the interlayer insulating layer 819 is formed using the conventional semiconductor processes. As illustrated in FIG. 12B, in the variation in the resistance values in the resistance distribution 2, 1σ is 31%. Accordingly, with one thermal treatment skipped, the variation decreases while the resistance value increases, compared to the resistance distribution 1.

As described above, the variation in the resistance values can be reduced by not performing the thermal treatment. However, the thermal treatment is generally indispensable to stabilize semiconductor elements or semiconductor devices. This is because, without the thermal treatment, the resistance change, endurance, and retention characteristics of the nonvolatile memory element become extremely unstable.

However, the difference between the resistance distribution 1 and the resistance distribution 2 shows that the thermal treatment is one factor of variation in the resistance values of the nonvolatile memory element.

FIG. 13 illustrates a cross-sectional TEM image of the nonvolatile memory element according to the conventional example.

As illustrated in FIG. 13, at the interface between the upper electrode 802 and the variable resistance layer 803, protrusions 901 are formed in the upper electrode 802. As described above, it is assumed that the formation of the protrusions 901, that is, the change in the form of the upper electrode 802 is due to the thermal treatment processes (twice with thermal treatment temperature at 400° C. and treatment time for 10 minutes).

Here, the interlayer insulating film (plasma TEOS film, for example) generally used tends to have stress that is changed by thermal treatment. More specifically, in the nonvolatile memory element according to the conventional example, the stress from the interlayer insulating layer 819 changes by the thermal treatment (thermal treatment temperature at 400° C.) generally used for the conventional semiconductor process. Accordingly, the stress from the interlayer insulating layer 819 is exerted on the upper electrode 802 in contact with the interlayer insulating layer 819, causing migration in the upper electrode 802. With this, the protrusions 901 as a result of the change in the form of the upper electrode 802 are formed at the upper electrode 802 on the side of the variable resistance layer 803 as illustrated in FIG. 13. The protrusions 901 are formed penetrating the high resistance layer with less oxygen deficiency in the variable resistance layer 803.

As a result, the thickness of the high resistance layer at the portion in which the protrusion 901 is formed is effectively reduced, reducing the resistance value. Furthermore, upon the formation of the protrusions 901, the amount of migration differs depending on the crystal grain boundary and the grain size at the upper electrode 802. Thus, it is difficult to control the amount of protrusions 901 formed. Consequently, since the amount and size of the protrusions 901 vary in each variable resistance element, the resistance value also varies in each variable resistance element.

Note that, it is assumed that the resistance values in the resistance distribution 2 in FIG. 12B increase because the amount of the protrusions 901 formed by the thermal treatment described above is small and the size of the protrusions 901 is small as well.

The cause of the variations in the resistance values in the conventional variable resistance nonvolatile memory element are as described above. The present invention has been conceived in view of these findings.

In order to achieve the abovementioned object, in the nonvolatile memory according to an aspect of the present invention, the interlayer insulating layer may be formed to cover at least the upper surface and the side surfaces of the upper electrode layer via the stress buffering region layer, the contact may be formed to penetrate the interlayer insulating layer and the stress buffering region layer, extending up to the upper electrode layer, and the stress buffering region layer is provided between the upper electrode layer and the interlayer insulating layer to directly cover at least the upper surface and the side surfaces of the upper electrode layer, and buffers the stress on the upper electrode layer from the interlayer insulating layer.

With this configuration, it is possible to implement a variable resistance nonvolatile memory element capable of suppressing the variation in the resistance values. More specifically, it is possible to buffer the stress applied from the interlayer insulating layer to the upper electrode layer by the thermal treatment by the stress buffering region layer directly covering at least the upper surface and the side surfaces of the upper electrode layer. With this, it is possible to suppress the change in the form (formation of protrusion) of the upper electrode layer due to the migration of the upper electrode layer, and to implement a high-quality nonvolatile memory without variation in the initial operation or operation characteristics of the resistance values. Note that, as described above, the stress generated by the thermal treatment, is mostly applied to the interface between the upper electrode layer and the interlayer insulating layer. Thus, the interlayer insulating layer may be formed to cover at least this interface region (the upper surface and the side surfaces of the upper electrode layer).

Furthermore, the stress buffering region layer may be provided to directly cover at least the upper surface and the side surfaces of the upper electrode layer, and side surfaces of the contact.

With this configuration, the stress applied from the interlayer insulating layer to the upper electrode layer due to thermal treatment is buffered by the stress buffering region layer surrounding the upper electrode layer. Furthermore, by forming the stress buffering region layer between the contact contacting the upper electrode layer and the interlayer insulating layer, it is possible to buffer (reduce) the stress of the interlayer insulating layer applied to the contact from the stress buffering region layer. In other words, the stress applied from the interlayer insulating layer to the upper electrode layer through the contact can also be suppressed. With this, the change in the form of the upper electrode layer due to migration can further be suppressed. Thus, it is possible to implement high-quality nonvolatile memory element without variations in the initial operation and the operational characteristics of the resistance values.

Here, the stress buffering region layer may be an insulating layer having porous structure.

With this, by forming the stress buffering region layer with the insulating layer with porous structure, more than one adjacent nonvolatile memory elements can be included. In other words, with this configuration, it is possible to form the stress buffering region layer with the insulating layer with porous structure simultaneously in a region larger than the nonvolatile memory element. With this, it is possible to form the stress buffering region layer without using the minimum pattern in the process rule. In other words, micro process is not necessary for forming the stress buffering region layer. Thus, it is suitable for miniaturizing the nonvolatile memory element. In other words, by depositing the insulating layer with porous structure, it is possible to form the stress buffering region layer. Thus, it is possible to share the insulating layer to be the stress buffering region layer by adjacent nonvolatile memory elements, without a special process. Therefore, it is possible to use the insulating layer for miniaturized process of the nonvolatile memory element.

Furthermore, the stress buffering region layer may be an air layer.

As described above, by configuring the stress buffering region layer with the air layer made of air with smaller stress than the stress of the insulating layer used for the interlayer insulating layer, it is possible to reliably prevent the stress from the interlayer insulating layer to the upper electrode layer or to the contact. With this, it is possible to reliably prevent the stress on the upper electrode layer. Thus, it is possible to suppress the change in the form (formation of protrusion) of the upper electrode layer by migration. With this, it is possible to implement the nonvolatile memory of higher quality without variation in the initial operation and the operational characteristics of the resistance values.

Furthermore, the upper electrode layer may include a platinum group element or an alloy including a platinum group element, and the platinum group element may be platinum or palladium.

Furthermore, the metal oxide may include a tantalum oxide $TaO_x$, where $0<x<2.5$. Here, it is preferable that the metal oxide includes a tantalum oxide, the first variable layer represented as $TaO_x$ and the second variable resistance layer represented as $TaO_y$ satisfy $0.8 \leq x \leq 1.9$, and $2.1 \leq y < 2.5$.

With this configuration, it is possible to suppress the formation of protrusions in the upper electrode layer, and the upper electrode layer and the second variable resistance layer with smaller oxygen deficiency can be formed with the stable form. Furthermore, it is possible to implement the nonvolatile memory element with reversibly stable rewriting characteristics and good retention characteristics, in addition to the fast speed of the operation.

Furthermore, the fabrication method of the nonvolatile memory element according to an aspect of the present invention includes: a first process of forming a lower electrode on a substrate; a second process of forming a first variable resistance layer including a metal oxide on the lower electrode layer; a third process of forming, on the first variable resistance layer, a second variable resistance layer including a metal oxide having smaller oxygen deficiency than oxygen deficiency of the first variable resistance layer; a fourth process of forming an upper electrode layer on the second variable resistance layer; a fifth process of forming a stress buffering region layer for buffering a stress on the upper electrode layer, the stress buffering region layer being formed to directly cover at least an upper surface and side surfaces of the upper electrode layer; a sixth process of forming an interlayer insulating layer to cover at least side surfaces of the lower electrode layer, the first variable resistance layer, and the second variable resistance layer; a seventh process of forming a contact extending to the upper electrode layer; and an eighth process of forming a wiring pattern connected to the contact, in which, in the fifth process, the stress buffering layer is formed using a material having a stress smaller than an insulating layer used as the interlayer insulating layer.

With this, the stress applied from the interlayer insulating layer to the upper electrode layer due to thermal treatment is buffered by the stress buffering region layer directly covering at least the upper surface and the side surfaces of the upper electrode layer. In addition, the stress from the interlayer insulating layer applied to the upper electrode layer can be reduced. Thus, it is possible to implement the fabrication method for the variable resistance nonvolatile memory element capable of suppressing the variation in the resistance values. More specifically, it is possible to suppress the change in form (formation of protrusion) of the upper electrode layer by migration of the upper electrode layer, and thus, it is possible to implement high-quality nonvolatile memory without variation in the initial operation and operational characteristics of the resistance values.

Furthermore, in the fifth process, the stress buffering region layer may be formed to directly cover at least the upper surface and the side surfaces of the upper electrode layer, using an insulating layer having a stress lower than the stress of the insulating layer used for the interlayer insulating layer, in the sixth process, the interlayer insulating layer may be formed to cover at least the upper surface and the side surfaces of the upper electrode layer via the stress buffering region layer, in the seventh process, the contact may be formed to penetrate the interlayer insulating layer and the stress buffering region layer to extend to the upper electrode layer.

Furthermore, it is possible to form the stress buffering region layer at least between the upper electrode layer and the interlayer insulating layer. Thus, it is possible to buffer (reduce) the stress applied to the upper electrode layer from the interlayer insulating layer due to thermal treatment. With this, it is possible to suppress the change in the form (formation of protrusion) of the upper electrode layer due to the migration, and to implement a high-quality nonvolatile memory without variation in the initial operation or operation characteristics of the resistance values.

Furthermore, the fifth process and the sixth process may further include: forming a sacrificial layer to cover at least the upper surface and the side surfaces of the upper electrode layer, the sacrificial layer being a layer to be removed later; forming the interlayer insulating layer to cover at least the upper surface and the side surfaces of the upper electrode layer via the sacrificial layer; and forming an air layer by removing the sacrificial layer so as to form the air layer for buffering stress on the upper electrode layer from the interlayer insulating layer, the seventh process may include forming a contact opening penetrating the interlayer insulating layer and the stress buffering region layer to extend to the upper electrode layer, and forming the contact at the contact opening, in the forming of an air layer, the stress buffering region layer may be formed by removing the sacrificial layer from the contact opening by etching after the contact opening is formed.

With this, it is possible to form the air layer (air gap) as the stress buffering region layer at least between the upper electrode layer and the interlayer insulating layer. Thus, it is possible to reliably prevent the stress from the interlayer insulating layer to the upper electrode layer. With this, it is possible to suppress the change in the form (formation of protrusion) of the upper electrode layer due to the migration, and to implement a high-quality nonvolatile memory without variation in the initial operation or operation characteristics of the resistance values.

Furthermore, the sixth process may include: forming an insulating layer to cover the upper electrode layer, the first variable resistance layer, the second variable resistance layer and the lower electrode layer, the insulating layer including a same material as the interlayer insulating layer; and forming the interlayer insulating layer by removing an insulating layer made of a same material as the interlayer insulating layer to expose at least the upper electrode layer, and in the fifth process, the stress buffering region layer may be formed, after the sixth process, with an insulating layer to directly cover at least the upper surface and the side surfaces of the upper electrode layer and the side surfaces of the contact after the sixth process, the insulating layer having a stress smaller than the stress of the insulating layer and buffering stress on the upper electrode layer from the interlayer insulating layer, and in the seventh process, the contact may be formed penetrating the stress buffering region layer to extend to the upper electrode layer.

Furthermore, it is possible to form the stress buffering region layer at least between the upper electrode layer and the interlayer insulating layer, and between the contact contacting the upper electrode layer and the interlayer insulating layer. With this, it is possible to buffer (reduce) the stress applied from the interlayer insulating layer to the upper electrode layer by the thermal treatment by the stress buffering region layer. Furthermore, it is possible to buffer the stress applied to the contact contacting the upper electrode layer from the interlayer insulating layer by the stress buffering region layer. Thus, it is possible to buffer the stress applied from the interlayer insulating layer to the upper electrode layer via the contact.

With this, it is possible to further suppress the change in the form (formation of protrusions) of the upper electrode layer by migration. Thus, it is possible to implement higher-quality nonvolatile memory element without variation in the initial operations and operational characteristics of the resistance values.

Furthermore, the fifth process and the sixth process may include: forming an insulating layer to cover the upper electrode layer, the first variable resistance layer, the second variable resistance layer and the lower electrode layer, the insulating layer including a same material as the interlayer insulating layer; and forming the interlayer insulating layer and an air layer as the stress buffering region layer for buffering the stress on the upper electrode layer from the interlayer insulating layer by removing the insulating layer including the same material as the interlayer insulating layer so as to expose at least the upper electrode layer, in the seventh process, the contact may be formed penetrating the interlayer insulating layer to extend to the upper electrode layer.

With this, it is possible to form the air layer (air gap) as the stress buffering region layer at least between the upper electrode layer and the interlayer insulating layer, and between the contact contacting the upper electrode layer and the interlayer insulating layer. Thus, it is possible to reliably prevent the stress applied from the interlayer insulating layer to the upper electrode layer by the thermal treatment by the stress buffering region layer. Furthermore, it is possible to reliably prevent the stress applied from the interlayer insulating layer to the contact contacting the upper electrode layer, and the stress applied from the interlayer insulating layer to the upper electrode layer through the contact by the stress buffering region layer.

With this, it is possible to further suppress the change in the form of the upper electrode layer by migration. Thus, it is possible to implement higher-quality nonvolatile memory element without variation in the initial operations and operational characteristics of the resistance values.

Here, in the fourth process, it is preferable that the upper electrode layer includes a platinum group element or an alloy including a platinum group element. In particular, it is preferable that the platinum group element is platinum or palladium.

Furthermore, in the second process and the third process, the metal oxide may include a tantalum oxide, the first variable layer represented as $TaO_x$ and the second variable resistance layer represented as $TaO_y$ may be formed to satisfy $0.8 \leq x \leq 1.9$, and $2.1 \leq y < 2.5$.

With this, it is possible to suppress the formation of protrusions in the upper electrode layer, and form an upper electrode layer in the stable form and the variable resistance layer with small oxygen deficiency. Thus, it is possible to implement the nonvolatile memory element having reversibly stable rewriting characteristics and good retention characteristics in addition to the high speed of the operation.

Advantageous Effects of Invention

As described above, according to the present invention, it is possible to implement variable resistance nonvolatile memory element capable of suppressing the variation in the resistance values. In the nonvolatile memory element according to the present invention, a stress buffering region layer is formed at least between the upper electrode layer and the interlayer insulating layer. Thus, it is possible to buffer the stress applied from the interlayer insulating layer to the upper electrode layer due to thermal treatment, and can suppress the change in the form of the upper electrode layer due to the stress. Furthermore, it is possible to buffer or prevent the stress from the interlayer insulating layer applied to the contact contacting the upper electrode layer by the stress buffering region layer. Thus, it is possible to prevent the change in the form of the upper electrode layer due to migration. With this, it is possible to implement the nonvolatile memory of higher quality without variation in the initial operation and the operational characteristics of the resistance values.

BRIEF DESCRIPTION OF DRAWINGS

FIG. 7C is a cross-sectional diagram illustrating a fabrication process for the nonvolatile memory element according to the embodiment 3 of the present invention.

FIG. 7D is a cross-sectional diagram illustrating a fabrication process for the nonvolatile memory element according to the embodiment 3 of the present invention.

FIG. 7E is a cross-sectional diagram illustrating a fabrication process for the nonvolatile memory element according to the embodiment 3 of the present invention.

DESCRIPTION OF EMBODIMENTS

Figure 1A:
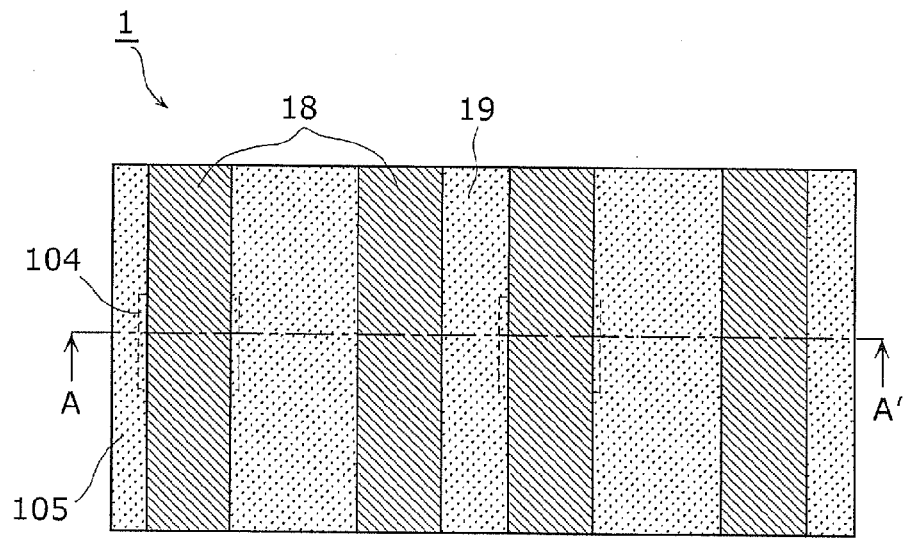
FIG. 1A illustrates a configuration of the nonvolatile memory element according to the embodiment 1 of the present invention.

The following describes a nonvolatile memory element and the method of fabricating the nonvolatile memory element according to the embodiments of the present invention with reference to the drawings. Note that the same reference numerals in the drawings refer to the same components, and when the description for these components has already been made, the description for these components may be omitted. In addition, in order to facilitate the understanding, the components are schematically illustrated. Thus, the shapes of the elements in the drawings are not necessarily accurate, for example, and the number of the components is also determined for illustration purpose.

(Embodiment 1)
[Configuration of Nonvolatile Memory Element]

Figure 1B:
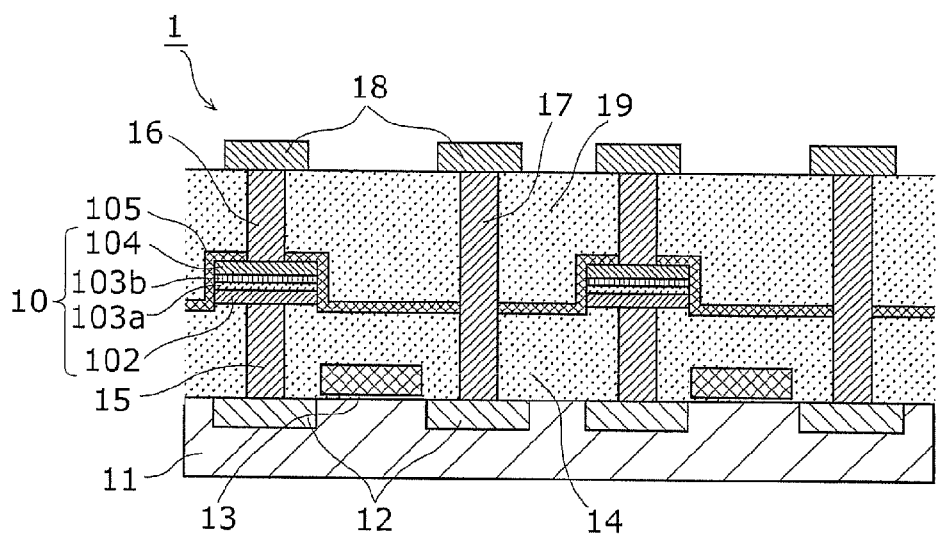
FIG. 1B illustrates a configuration of the nonvolatile memory element according to the embodiment 1 of the present invention.

FIGS. 1A and 1B illustrate a configuration of the nonvolatile memory element according to the embodiment 1 of the present invention. FIG. 1A is a plan view, and FIG. 1B is a cross-sectional view of the line A-A' in FIG. 1A viewed in the direction of the arrows. FIGS. 1A and 1B illustrate an example in which two variable resistance elements 10 are included. In the embodiment 1, an insulating layer with reduced stress is provided as a stress buffering region layer 105 at least to cover an upper electrode layer 104. The stress buffering region layer 105 is capable of buffering the stress at an interface between the upper electrode layer 104 and a second interlayer insulating layer 19.

The nonvolatile memory element 1 illustrated in FIG. 1B includes a variable resistance element 10, a silicon substrate 11, a source/drain layer 12, a gate layer 13, a first interlayer insulating layer 14, a first contact 15, a second contact 16, a third contact 17, a wiring pattern 18, a second interlayer insulating layer 19, and a stress buffering region layer 105. The variable resistance element 10 includes a lower electrode layer 102, a first variable resistance layer 103a, a second variable resistance layer 103b, and the upper electrode layer 104.

The gate layer 13 is formed above the silicon substrate 11.

The source/drain layer 12 is formed on the silicon substrate 11.

The first contact 15 is formed to penetrate the first interlayer insulating layer 14, connecting the source/drain layer 12 and the lower electrode layer 102 of the variable resistance element 10. The first contact 15 comprises, for example, tungsten or copper.

The variable resistance element 10 is formed on the first interlayer insulating layer 14 and the first contact 15. More specifically, the lower electrode layer 102 is formed on the first contact 15, contacting the first contact 15. The first variable resistance layer 103a is formed on the lower electrode layer 102, and comprises a metal oxide. The second variable resistance layer 103b is formed on the first variable resistance layer 103a, and comprises a metal oxide with smaller oxygen deficiency than the oxygen deficiency of the first variable resistance layer 103a. Note that, the stacked structure of the first variable resistance layer 103a and the second variable resistance layer 103b is formed as the variable resistance layer 103 in the variable resistance element 10. In addition, the upper electrode layer 104 is formed substantially planar on the second variable resistance layer 103b. Here, "substantially planar" refers to the state in which a length between the uppermost end and the lowermost end of a protrusion is 5 nm or less.

Here, the first variable resistance layer 103 and the second variable resistance layer 103b comprise a first transition metal oxide layer made of an oxygen deficient transition metal oxide and a second transition metal oxide layer made of a transition metal oxide with smaller oxygen deficiency and the oxygen deficiency of the first transition metal oxide layer, respectively. In the embodiment 1, as an example, a homogeneous transition metal is used for the first transition metal and the second transition metal, the first variable resistance layer 103a comprises oxygen-deficient first tantalum oxide layer ($TaO_x$), and the second variable resistance layer 103b comprises the second tantalum oxide layer ($TaO_y$). It is preferable that the first tantalum oxide layer $TaO_x$ satisfies $0.8 \leq x \leq 1.9$, and the second tantalum oxide layer $TaO_y$ is $2.1 \leq y < 2.5$. Here, the oxygen-deficient transition metal oxide refers to a transition metal oxide with Oxygen deficient from the stoichiometric composition. With the stacked structure of $TaO_x$ ($0.8 \leq x \leq 1.9$) and $TaO_y$ ($0.8 < y < 2.5$, $x < y$), it is possible to increase the speed of the operation of the nonvolatile memory element, achieving reversible stable rewriting characteristics. The thickness of the first variable resistance layer 103a is, for example, between 20 nm and 100 nm inclusive, and the thickness of the second variable resistance layer 103b is, for example, between 2 nm and 12 nm inclusive.

Here, the oxygen deficiency is a ratio of deficient Oxygen compared to the amount of oxygen comprising an oxide of each transition metal in the stoichiometric composition. The oxide in the stoichiometric composition usually has insulator property, while the oxygen-deficient transition metal oxide usually has semiconductor property. More specifically, it is preferable that the second variable resistance layer 103b has smaller oxygen deficiency, that is, higher resistance than the first variable resistance layer 103a. With this configuration, the voltage applied between the upper electrode layer 104 and the lower electrode layer 102 when the resistance changes allows more voltage to be provided for the second variable resistance layer 103b, making it more likely to cause oxidation-reduction reaction in the second variable resistance layer 103b. Here, the first transition metal comprising the first variable resistance layer 103a and the second transition metal comprising the second variable resistance layer 103b may be the same material or different materials. tantalum (Ta), titanium (Ti), hafnium (Hf), zirconium (Zr), niobium (Nb), tungsten (W), and others may be used as the transition metal. Since transition metals can take more than one oxidation state, different resistance states can be achieved by oxidation-reduction reaction. When different materials are used for the first transition metal and the second transition metal, it is preferable that the standard electrode potential of the second transition metal is smaller than the standard electrode potential of the first transition metal. It is assumed that the resistance change occurs as follows: oxidation-reduction reaction occurs in tiny filaments formed in the second variable resistance layer 103b with high resistance, changing the resistance value of the second variable resistance layer 103b. In addition, it is preferable that the dielectric constant of the second variable resistance layer 103b is higher than the dielectric constant of the first variable resistance layer 103a. Alternatively, it is preferable that the bandgap of the second variable resistance layer 103b is smaller than the bandgap of the first variable resistance layer 103a. By using the first variable resistance layer 103a and the second variable resistance layer 103b satisfying one or both of the conditions for the variable resistance layer 103, the breakdown strength of the second variable resistance layer 103b is smaller than the breakdown strength of the first variable resistance layer 103a, reducing the initial breakdown voltage. This is because, as illustrated in FIG. 1 in J. McPherson et al., IEDM 2002, pp. 633 to 636 (Non Patent Literature), there is a correlation between the breakdown strength and dielectric constant of the oxide layer, and the larger the dielectric constant is, the smaller the breakdown strength becomes. In addition, as illustrated in FIG. 2 in J. McPherson et al., IEDM 2002, pp. 633 to 636, there is a correlation between the breakdown strength and the bandgap of the oxide layer, and the larger the bandgap is, the larger the breakdown strength becomes.

For example, when the oxygen-deficient first tantalum oxide layer $TaO_x$ ($0.8 \leq x \leq 1.9$) is used as the first variable resistance layer 103a, it is preferable that the thickness of the first variable resistance layer 103a is 45 nm. When the oxygen-deficient second tantalum oxide layer $TaO_y$ ($2.1 \leq y < 2.5$) is used as the second variable resistance layer 103b, it is preferable that the thickness of the second variable resistance layer 103b is 5 nm.

Note that, the function and effect of the present invention are observed not only in the case of tantalum oxide, and the present invention is not limited to this example. For example, the stacked structure may comprise hafnium (Hf) oxides, or zirconium (Zr) oxides.

For example, when the stacked structure of the hafnium oxides is used, it is preferable that the composition of the first hafnium oxide represented as $HfO_x$ and the composition of the second hafnium oxide represented as $HfO_y$ satisfy $0.9 \leq x \leq 1.6$ and $1.8 < y < 2.0$. Alternatively, when the stacked structure of the zirconium oxides is used, for example, it is preferable that the composition of the first zirconium oxide represented as $ZrO_x$ and the composition of the second zirconium oxide represented as $ZrO_y$ satisfy $0.9 \leq x \leq 1.4$ and $1.9 < y < 2.0$.

It is preferable that the thickness of the upper electrode layer 104 is approximately 50 nm. Alternatively, the upper electrode layer 104 may comprise a platinum group element or an alloy including a platinum group element, and may be comprised of a single-layer structure or multiple-layered stacked structure. Here, the platinum group element includes platinum (Pt) and palladium (Pd). The reason for limiting the material of the upper electrode layer 104 is that the standard electrode potentials of platinum or palladium is higher than the standard electrode potentials of transition metal comprising the variable resistance layer 103 such as Ta, Hf, Zr, and others. Accordingly, Pt and Pd are suitable as the material for electrode since the electrode itself is less likely to be oxidized and promotes oxidation-reduction reaction of the variable resistance material, and they both have similar property, that is, high melting points and they are less likely to be eroded by acid or alkali.

Here, it is preferable that the upper electrode layer 104 includes simple substance or alloy of one of platinum and palladium, or an alloy comprising a combination of two or more materials. When the material of the variable resistance layer 103 is an oxygen-deficient transition metal oxide, the material of the upper electrode layer 104 is selected to have a higher standard electrode potential than the standard electrode potential of the transitional metal composing the oxygen-deficient transition metal oxide, and standard electrode potential of the lower electrode to have a smaller standard electrode potential than the standard electrode potential of the upper electrode. With this, it is possible to form a variable resistance layer with high oxygen concentration or low oxygen concentration at the interface between the electrode with higher standard electrode potential and the variable resistance layer, according to the applied voltage, and thereby allowing stable operation. In particular, when the oxygen-deficient transition metal oxide is tantalum oxide, this condition is satisfied if platinum or palladium is used for the electrode contacting the second tantalum oxide layer with small oxygen deficiency, and Ta, TaN, Ti, and others are used for the electrode contacting the first tantalum oxide layer with higher oxygen deficiency. When the oxygen-deficient transition metal oxide is hafnium oxide, this condition is satisfied if Hf, Ti, Al, and others are used for the electrode contacting the first hafnium oxide layer with higher oxygen deficiency. Similarly, in the case of zirconium oxide, Zr, Ti, Al, and others may be used as the electrode contacting the first zirconium oxide layer with higher oxygen deficiency. In both cases, platinum or palladium is used for the electrode contacting the second transition metal oxide layer with smaller oxygen deficiency.

The stress buffering region layer 105 is provided to directly cover at least the upper surface and the side surfaces of the upper electrode layer 104. The stress buffering region layer 105 buffers (reduces) the stress on the upper electrode layer 104. Note that, in FIG. 1B, the stress buffering region layer 105 covers the side surfaces of the second variable resistance layer 103b, the first variable resistance layer 103a, and the lower electrode layer 102. However, the configuration in which these side surfaces are not covered is possible. In the following description and in Claims, the state as in the stress buffering region layer 105 directly contacting and covering the upper electrode layer 104 illustrated in FIG. 1B is referred to as "directly covering". Alternatively, in the case where when it may be either as the second interlayer insulating layer 19 in FIG. 1B, which indirectly covers the side surfaces of the second variable resistance layer 103b, the first variable resistance layer 103a, and the lower electrode layer 102 via the stress buffering region layer 105, or as the second interlayer insulating layer 194 in FIG. 8B which shall be described later, which directly covers the side surfaces of the second variable resistance layer 103b, the first variable resistance layer 103a, and the lower electrode layer 102 without interposing the stress buffering region layer 405, it may be referred to simply as "covering".

Here, it is preferable that the material with smaller stress than the stress of the insulating material used for the second interlayer insulating layer 19 is used for the stress buffering region layer 105 in order to buffer the stress from the second interlayer insulating layer 19 to the upper electrode layer 104.

For example, when a plasma TEOS film which is generally used for the second interlayer insulating layer 19 is used, it is preferable that the stress buffering region layer 105 is formed using a plasma TEOS film deposited while reducing the power or the upper electrode (for example, the power or the upper electrode at 850 W or 500 W) compared to the plasma power generally applied for depositing the plasma TEOS film (for example, the upper electrode power at 1200 W, and the lower electrode power at 500 W), or an insulating layer with porous structure (such as porous silica). In this case, while the stress of the plasma TEOS film formed under the general condition is approximately 300 MPa, when the power of the upper electrode is reduced to 850 W, the stress of the formed plasma TEOS film is approximately 240 MPa. When the power of the upper electrode is further reduced to 500 W, the stress of the formed plasma TEOS film is reduced to 230 MPa. By forming the stress buffering region layer 105 as described above, it is possible to reduce the stress applied to the upper electrode layer 104. Accordingly, it is possible to reduce the variation in the initial resistance of the variable resistance layer 103.

Furthermore, when the stress buffering region layer 105 is formed using porous silica, for example, the stress of the formed porous silica is 30 MPa. As described above, when the stress buffering region layer 105 is formed using porous silica, compared to the case in which the stress buffering region layer 105 is formed using the plasma TEOS film formed reducing the power of the upper electrode, it is possible to further reduce the variation in the initial resistance.

The second interlayer insulating layer 19 is formed to cover the side surfaces of the lower electrode layer 102, the first variable resistance layer 103a and second variable resistance layer 103b, and the side surfaces and the upper surface of the upper electrode layer 104 via the stress buffering region layer 105.

The second contact 16 is formed extending to the upper electrode layer 104 and penetrating the second interlayer insulating layer 19 and the stress buffering region layer 105. The third contact 17 is formed extending to the source/drain layer 12 and penetrating the second interlayer insulating layer 19 and the first interlayer insulating layer 14. Here, in the same manner as the first contact 15, the second contact 16 and the third contact 17 are formed using tungsten or copper, for example.

The wiring pattern 18 is formed on the upper surface of the second interlayer insulating layer 19, and is connected to the second contact 16 and the third contact 17. With this, the upper electrode layer 104 in the variable resistance element 10 is connected to the wiring pattern 18 via the second contact 16, and the source/drain layer 12 is connected to the wiring pattern 18 via the third contact 17. The wiring pattern 18 is formed using copper and others, for example.

The nonvolatile memory element 1 is configured as described above.

[Operation of Nonvolatile Memory Element]

The following shall describe the operations of the nonvolatile memory element 1 with the configuration described above.

The nonvolatile memory element 1 operates when a first predetermined electric pulse (current pulse or voltage pulse) and a second predetermined electric pulse are applied between the lower electrode layer 102 and the upper electrode layer 104.

Here, as an example of the first predetermined electric pulse, a negative voltage pulse with respect to the lower electrode layer 102 is applied to the upper electrode layer 104. With the application of the first predetermined electric pulse, oxygen ions are diffused from the second variable resistance layer (high resistance layer) 103b arranged between the lower electrode layer 102 and the upper electrode layer 104 to the first variable resistance layer 103a. With this, the resistance value of the variable resistance layer 103 composed of the first variable resistance layer 103a and the second variable resistance layer 103b changes to a first predetermined resistance value (low resistance value), and this state is maintained.

On the other hand, when the second predetermined electric pulse (here, a voltage pulse of positive polarity with respect to the lower electrode layer 102) is applied between the lower electrode layer 102 and the upper electrode layer 104, the oxygen ions are diffused from the first variable resistance layer 103a to the second variable resistance layer 103b. With this, the resistance value of the variable resistance layer 103 composed of the first variable resistance layer 103a and the second variable resistance layer 103b changes to a second predetermined resistance value (high resistance value), and this state is maintained.

In the variable resistance layer 103 according to the embodiment 1, that is, the stacked structure of the second variable resistance layer 103b with low oxygen deficiency and the first variable resistance layer 103a with high oxygen deficiency, it is assumed that most of the resistance change occurs in the proximity of the interface in the second variable resistance layer 103b at the upper electrode layer 104.

Here, the first predetermined resistance value and the second predetermined resistance value are associated with the two values of binary data, for example. For example, the first predetermined resistance value (in the above case, low resistance value) is associated with "1" in the binary data, and the second predetermined resistance value (in the above case, high resistance value) is associated with "0" in the binary data.

Accordingly, it is possible to write binary data on the nonvolatile memory element 1 by applying the first or second predetermined electric pulse on the first variable resistance layer 103a and the second variable resistance layer 103b. In addition, the binary data written on the nonvolatile memory element 1 may be read out by supplying voltage or current which does not change the resistance values of the first variable resistance layer 103a and the second variable resistance layer 103b to the nonvolatile memory element 1 and by detecting the resistance values.

With this, the first variable resistance layer 103a and the second variable resistance layer 103b arranged between the lower electrode layer 102 and the upper electrode layer 104 serve as a storage unit.

Furthermore, the nonvolatile memory element 1 is connected to the transistor including the gate layer 13 and the source/drain layers 12 (voltage or current supply switch). Accordingly, by applying the voltage or current controlled by the transistor to the nonvolatile memory element 1 not only allows writing binary data on the nonvolatile memory element 1, but also reading the binary data written on the nonvolatile memory element 1.

In the embodiment 1, the stress buffering region layer 105 comprising an insulating layer with smaller stress than the stress from the second interlayer insulating layer 19 is formed between the second interlayer insulating layer 19 and the upper electrode layer 104. With this, the stress from the second interlayer insulating layer 19 generated due to the thermal treatment during fabrication is reduced by the stress buffering region layer 105, and thus the stress applied on the upper electrode layer 104 is reduced. Note that, the description for the reason shall be described later and thus omitted here. Accordingly, in the variable resistance element 10 according to the embodiment 1, the change in the form of the upper electrode layer 104 (protrusions) due to the stress is suppressed. Therefore, the upper electrode layer 104 can maintain a substantially planar surface. Here, "substantially planar" refers to the state in which a length between the uppermost end and the lowermost end of a protrusion is 5 nm or less.

Accordingly, the form for the second variable resistance layer 103b with high resistance becomes also stable, allowing obtaining resistance values of the variable resistance element 10 while suppressing the variation in the resistance values. Therefore, stable binary data can be obtained.

[Method of Fabricating Nonvolatile Memory Element]

Next, the fabrication method for the nonvolatile memory element 1 according to the embodiment 1 of the present invention shall be described.

FIGS. 2A to 2F are cross-sectional diagrams illustrating fabrication processes of the nonvolatile memory element 1 according to the embodiment 1 of the present invention. Note that, although multiple nonvolatile memories 1 are formed on the silicon substrate 11, only one nonvolatile memory element is illustrated for simplifying the illustration. In addition, part of the drawings is enlarged in order to facilitate the understanding.

Figure 2A:
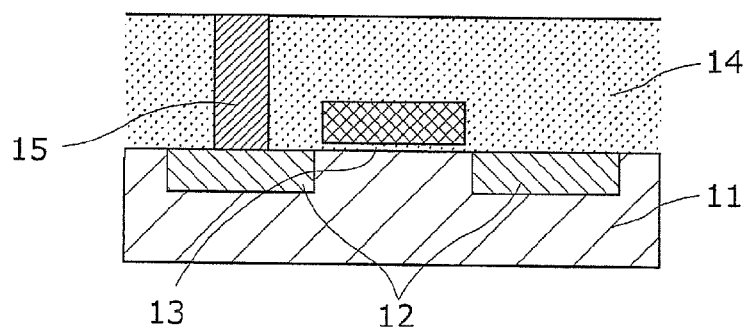
FIG. 2A is a cross-sectional diagram illustrating a fabrication process for the nonvolatile memory element according to the embodiment 1 of the present invention.

First, in the process described in FIG. 2A, after forming the gate layer 13 and the source/drain layer 12 on the silicon substrate 11, the first interlayer insulating layer 14 comprising the plasma TEOS film and $SiO_2$ is formed. Next, the first contact 15 penetrating the first interlayer insulating layer 14 and connected to the source/drain layer 12 is formed. The first contact 15 comprises, for example, tungsten and copper.

Figure 2B:
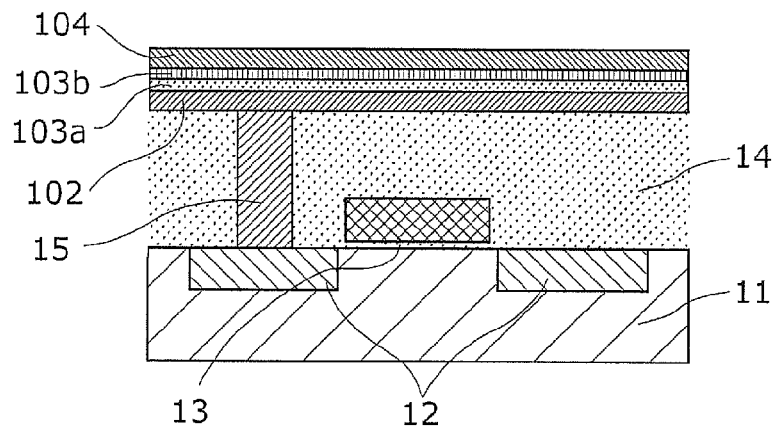
FIG. 2B is a cross-sectional diagram illustrating a fabrication process for the nonvolatile memory element according to the embodiment 1 of the present invention.

Next, in the process illustrated in FIG. 2B, the lower electrode layer 102, the first variable resistance layer 103a, the second variable resistance layer 103b, and the upper electrode layer 104 are formed in this order on the first interlayer insulating layer 14 to directly cover the upper surface of the first contact 15 that is exposed.

Note that, in the following description, the lower electrode layer 102, the first variable resistance layer 103a, the second variable resistance layer 103b, and the upper electrode layer 104, may not only be in the state in which the etching in the predetermined patterned shape is performed, but also be in the formed state.

Figure 2C:
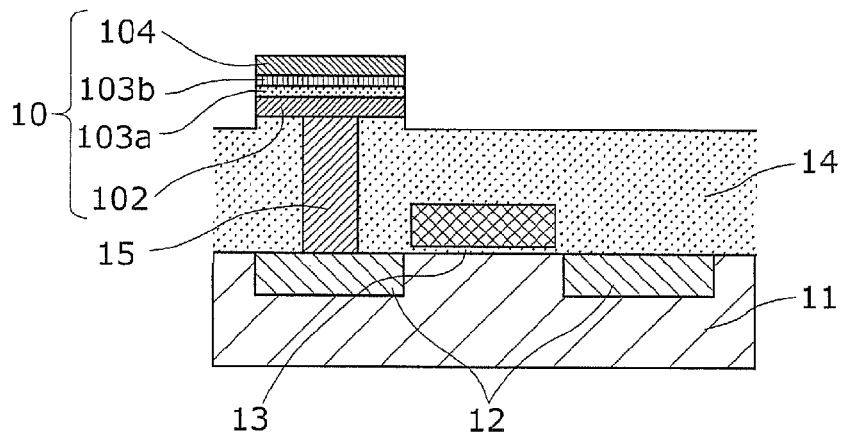
FIG. 2C is a cross-sectional diagram illustrating a fabrication process for the nonvolatile memory element according to the embodiment 1 of the present invention.

Next, in the process illustrated in FIG. 2C, the upper electrode layer 104, the second variable resistance layer 103b, the first variable resistance layer 103a, and the lower electrode layer 102 are formed into the predetermined patterned shape by regular exposure process, development process, and dry etching process. The variable resistance element 10 including 30 nm of tantalum nitride (TaN) as the lower electrode layer 102, 45 nm of oxygen-deficient tantalum oxide (when represented as $TaO_x$, $0.8 \leq x \leq 1.9$) as the first variable resistance layer 103a, 5 nm of oxygen deficient tantalum oxide (when represented as $TaO_y$, $0.8 < y < 2.5$, and $x < y$) as the second variable resistance layer 103b, and 50 nm of platinum (Pt) as the upper electrode layer 104.

Here, $TaO_x$ as the first variable resistance layer 103a may be deposited for 50 nm by reactive sputtering in which sputtering is performed in an atmosphere including oxygen, using Ta target, and the upper surface of TaO$_x$ may be oxidized by plasma oxidation in oxygen atmosphere. With this, on the first variable resistance layer 103a comprising TaO$_x$, the second variable resistance layer 103b comprising TaO$_y$ (0.8<y<2.5, x<y) with lower oxygen deficiency than the oxygen deficiency of TaO$_x$ is formed for 5 nm. In this case, the method of oxidation processing is not limited to plasma oxidation, but a treatment effective for oxidizing the surface such as a thermal treatment in the oxygen atmosphere may be performed. Alternatively, after depositing 45 nm of TaO$_x$, 5 nm of Ta$_2$O$_5$ may be deposited instead of oxidation. The reactive sputtering allows adjusting the oxygen deficiency included in the film by changing the concentration in the sputtering atmosphere, or by using the transition metal oxide target as the target. The same method may be used when forming a stacked structure including hafnium and zirconium oxides. Note that, it is preferable that the first variable resistance layer 103a has a thickness of 10 nm or more. In addition, it is preferable that the thickness of the second variable resistance layer 103b is between 1 nm and 10 nm inclusive in the case of tantalum oxide, between 3 nm and 4 nm inclusive in the case of hafnium oxide, and between 1 nm and 5 nm inclusive in the case of zirconium oxide.

As described above, the variable resistance element 10 including the upper electrode layer 104, the second variable resistance layer 103b, the first variable resistance layer 103a and the lower electrode layer 102 is formed. In other words, the lower electrode layer 102 is formed on the silicon substrate 11, and the first variable resistance layer 103a comprising a metal oxide is formed on the lower electrode layer 102. Subsequently, the variable resistance element 10 is formed by forming, on the first variable resistance layer 103a, the second variable resistance layer 103b comprising a metal oxide with a lower oxygen deficiency than the oxygen deficiency of the first variable resistance layer 103a, and forming the upper electrode layer 104 on the second variable resistance layer 103b.

Figure 2D:
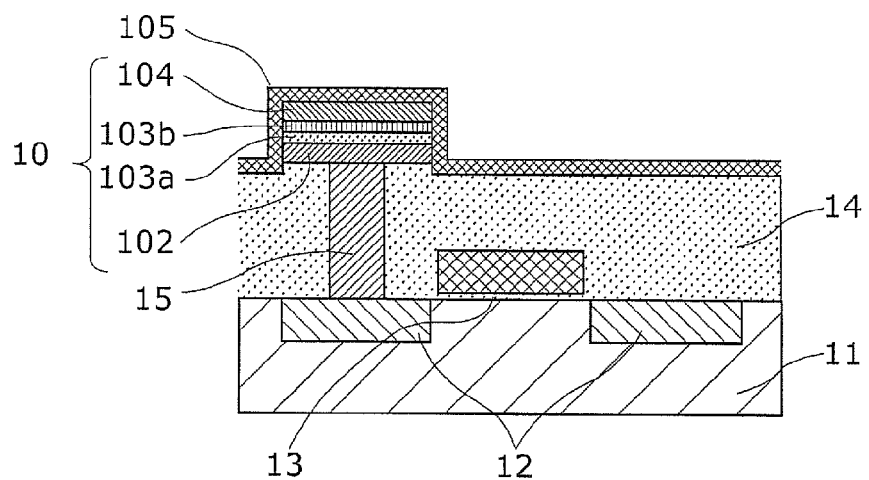
FIG. 2D is a cross-sectional diagram illustrating a fabrication process for the nonvolatile memory element according to the embodiment 1 of the present invention.

Next, in the process illustrated in FIG. 2D, the stress buffering region layer 105 for buffering the stress with respect to the upper electrode layer 104 is provided to directly cover at least the top surface and the side surfaces of the upper electrode layer 104. More specifically, the stress buffering region layer 105 is formed to directly cover the upper surface of the first interlayer insulating layer 14, the side surfaces of the lower electrode layer 102, the first variable resistance layer 103a and the second variable resistance layer 103b, and the upper surface and the side surfaces of the upper electrode layer 104.

Here, the stress buffering region layer 105 preferably comprising a material with a smaller stress than the stress of the second interlayer insulating layer 19 such that the stress buffering region layer 105 buffers the stress from the second interlayer insulating layer 19 formed by the following process to the upper electrode layer 104. For example, when the plasma TEOS film is used as the second interlayer insulating layer 19 as described above, the plasma TEOS film with reduced stress used as the stress buffering layer 105, and is formed by depositing the plasma TEOS film with reduced power of the upper electrode (upper electrode power at 850 W or 500 W) compared to the plasma power generally used for depositing the plasma TEOS film (upper electrode power at 1200 W, lower electrode power at 500 W). Furthermore, the stress buffering region layer 105 may comprise an insulating layer with porous structure (porous silica and others).

Figure 2E:
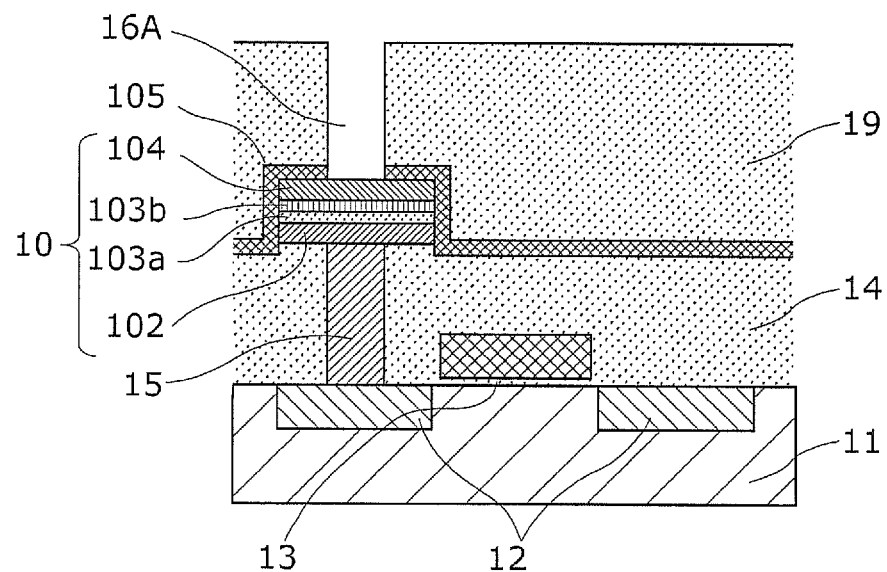
FIG. 2E is a cross-sectional diagram illustrating a fabrication process for the nonvolatile memory element according to the embodiment 1 of the present invention.

Next, in the process illustrated in FIG. 2E, the second interlayer insulating layer 19 is formed to cover at least the side surfaces of the lower electrode layer 102, the first variable resistance layer 103a and the second variable resistance layer 103b, and the second contact 16 is formed extending to the upper electrode layer 104.

More specifically, first, the second interlayer insulating layer 19 is formed to cover at least the upper surface and the side surfaces of the upper electrode layer 104 through the stress buffering region layer 105. Here, the second interlayer insulating layer 19 is formed to cover the stress buffering region layer 105. Next, the second contact opening 16A is formed penetrating the second interlayer insulating layer 19 and the stress buffering region layer 105 and extending to the upper electrode layer 104 at a predetermined position for forming the second contact 16 connected to the upper electrode layer 104.

More specifically, in the processes illustrated in FIGS. 2D and 2E, first, a plasma TEOS film with reduced stress is deposited for 10 nm or more and 100 nm or less as the stress buffering region layer 105 while reducing the power of the upper electrode in the plasma TEOS film forming device from the conventional 1200 W to 850 W or less. Next, in the conventional semiconductor process using the resist mask, the pattern for the stress buffering region layer 105 is formed in a shape larger than the variable resistance element 10 such that a region directly covering at least the variable resistance element 10 remains. Next, the second interlayer insulating layer 19 (for example, the plasma TEOS film formed in the conventional plasma power) is deposited, and the surface of the second interlayer insulating layer 19 is planarized. As described above, by using the material same as the second interlayer insulating layer 19, it is possible to increase the deposition speed of the stress buffering region layer 105.

Figure 2F:
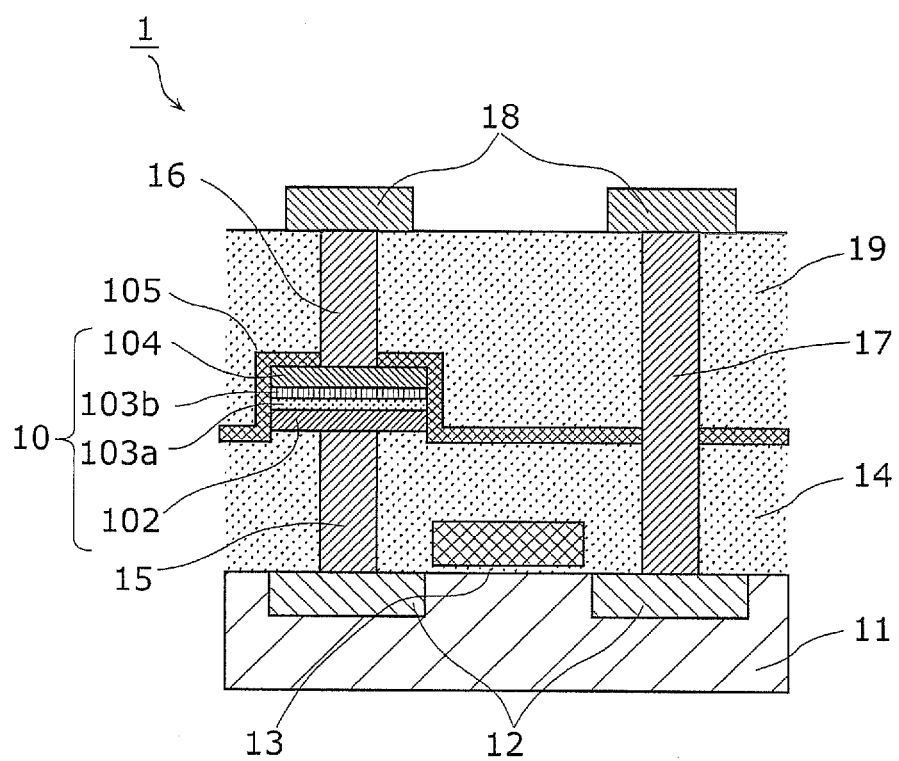
FIG. 2F is a cross-sectional diagram illustrating a fabrication process for the nonvolatile memory element according to the embodiment 1 of the present invention.

Next, in the process illustrated in FIG. 2F, the second contact 16 is formed to extend to the upper electrode layer 104, forming the wiring pattern 18 connected to the second contact. More specifically, first, by the conventional semiconductor process, the second contact 16 is formed using tungsten and copper at the second contact opening 16A. In addition, the third contact 17 penetrating the second interlayer insulating layer 19, the stress buffering region layer 105, and the first interlayer insulating layer 14 and connected to the source/drain layer 12 is formed using tungsten or copper. Next, the wiring patterns 18 each connected to the second contact 16 or the third contact 17 is formed on the upper surface of the second interlayer insulating layer 19. The wiring pattern 18 is formed using copper and others.

The nonvolatile memory element 1 is fabricated as described above.

As described above, in the nonvolatile memory element 1, the stress buffering region layer 105 is formed between at least the second interlayer insulating layer 19 and the upper electrode layer 104. Thus, it is possible to reduce the stress applied from the second interlayer insulating layer 19 to the upper electrode layer 104. Accordingly, in the nonvolatile memory element 1, it is possible to suppress the change in the form (formation of protrusion) of the upper electrode layer 104 due to the stress from the second interlayer insulating layer 19 to the upper electrode layer 104. Thus, it is possible to form the upper electrode layer 104 to be substantially planar.

With this, it is possible to stabilize the form of the variable resistance element 10, thereby implementing the nonvolatile memory element 1 including the variable resistance element 10 having suppressed variation in the resistance values. Furthermore, it is possible to stabilize the operations of the nonvolatile memory element 1 comprising one nonvolatile storage unit with one transistor and one variable resistance element (hereafter abbreviated as "one transistor/one variable resistance element) using the variable resistance element 10.

Note that, in the process in FIG. 2E, the stress buffering region layer 105 may be continuously formed instead of the second interlayer insulating layer 19. In this case, the part above the upper surface and the side surfaces of the upper electrode layer 104 in the variable resistance element 10 is directly covered with the stress buffering region layer 105. With this configuration, it is possible to make the quality of the insulating layer for forming the second contact 16 uniformly, thereby stabilizing the cross-sectional shape of the second contact 16 and the third contact 17.

Next, the relationship between the upper electrode power when forming the plasma TEOS film and the stress of the formed plasma TEOS film shall be described.

Figure 3A:
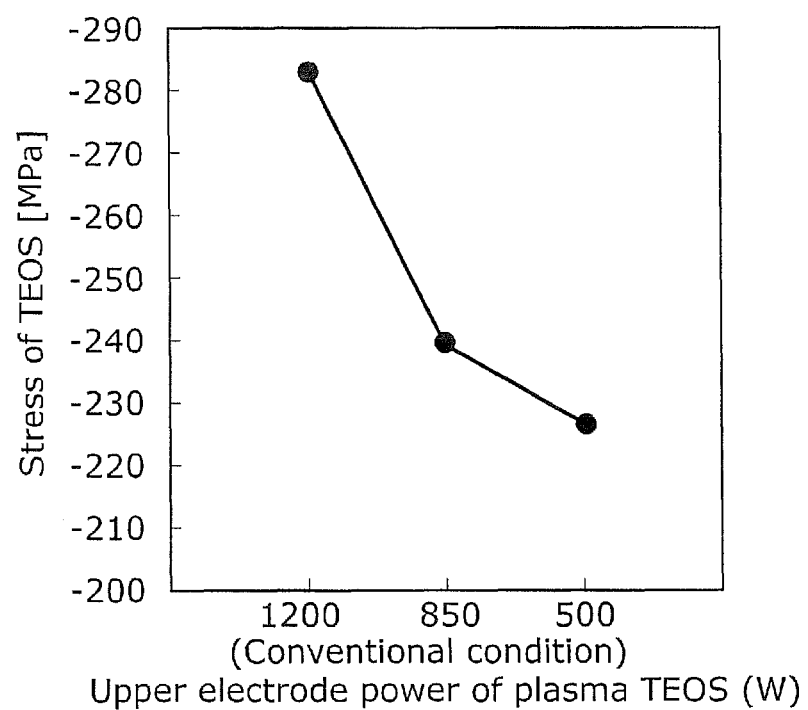
FIG. 3A illustrates a relationship between the power at the upper electrode when forming the plasma TEOS film and a stress of the formed plasma TEOS film according to the embodiment 1 of the present invention.
Figure 3B:
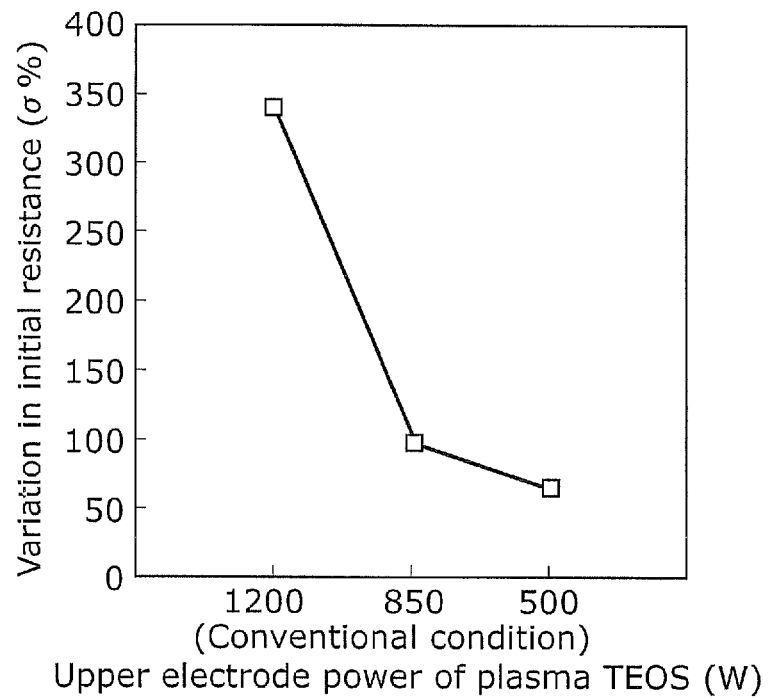
FIG. 3B is a diagram illustrating a relationship between the power at the upper electrode when forming the plasma TEOS film and the variation in initial resistance of the nonvolatile memory element using the formed plasma TEOS film according to the embodiment 1 of the present invention.

FIG. 3A illustrates the relationship between the upper electrode power when forming the plasma TEOS film according to the embodiment 1 and the stress of the formed plasma TEOS film. FIG. 3B is a diagram illustrating a relationship between the power at the upper electrode when forming the plasma TEOS film according the embodiment 1 of the present invention and the variations in initial resistance of the nonvolatile memory element using the formed plasma TEOS film.

FIG. 3A illustrates the relationship between the upper electrode power when forming the plasma TEOS film and the stress of the formed plasma TEOS film in the process of forming the stress buffering region layer 105 illustrated in FIGS. 2D and 2E using the plasma TEOS film. As illustrated in FIG. 3A, when the upper electrode power used in the embodiment 1 is 850 W, the stress of the plasma TEOS film is approximately 240 MPa, and when the upper electrode power is 500 W, the stress of the plasma TEOS film is approximately 225 MPa. The stress of the plasma TEOS film is lower than the stress of the plasma TEOS film formed in the upper electrode power at 1200 W which is the general forming condition (conventional condition) (approximately 285 MPa).

In addition, FIG. 3B illustrates the variation in the initial resistance values of the variable resistance element 10 using the stress buffering region layer 105 formed in each condition illustrated in FIG. 3A. Here, σ% is a value represented in % calculated by dividing the standard deviation σ by the average value of the initial resistance values. As illustrated in FIG. 3B, when the plasma TEOS film formed in the upper electrode power at 1200 W is used, the σ% is 340%. In contrast, σ% is 96% when the plasma TEOS film is formed in the upper electrode power at 850 W, and is 66% when the plasma TEOS film is formed in the upper electrode power at 500 W, indicating significant improvement. This result shows that the variable resistance element 10 with reduced variation in the initial resistance values can be fabricated by forming the stress buffering region layer 105 at least at the upper surface and the side surfaces of the upper electrode layer 104. It is possible to fabricate the nonvolatile memory element 1 with stable operation by comprising one nonvolatile storage unit with one transistor/one variable resistance element, using the variable resistance element 10.

(Variation)

Note that, the stress buffering region layer 105 may be comprised, not only of the plasma TEOS film with reduced stress described above, but also of porous structure. This configuration shall be described as a variation of the embodiment 1 as follows.

In this variation, in the processes described in FIG. 2D, the stress buffering region layer 105 comprised of porous structure is formed to directly cover the upper surface of the first interlayer insulating layer 14, the side surfaces of the lower electrode layer 102, the side surfaces of the first variable resistance layer 103a, the side surfaces of the second variable resistance layer 103b, and the upper surface and the side surfaces of the upper electrode layer 104.

In addition, in the process illustrated in FIG. 2E, the second interlayer insulating layer 19 is formed to cover the upper surface and the side surfaces of the stress buffering region layer 105 comprised of porous structure. Subsequently, at a predetermined position for forming the second contact 16 in the later process, a second contact opening 16A is formed to penetrate the second interlayer insulating layer 19 and the stress buffering region layer 105 to extend to the upper electrode layer 104.

More specifically, in the processes illustrated in FIGS. 2D and 2E, the stress buffering region layer 105 comprised of porous structure is comprised of porous silica which is low-k material with the stress reduced to 30 MPa. Here, porous silica with a size between 10 nm and 100 nm inclusive is deposited by applying the liquid material which is a mixture of silica precursor and surface active agent and performing thermal treatment.

Next, in the process illustrated in FIG. 2F, the second contact 16 is formed at the second contact opening 16A. In addition, the third contact 17 penetrating the second interlayer insulating layer 19, the stress buffering region layer 105, and the first interlayer insulating layer 14 and connected to the source/drain layer 12 is formed. Next, the wiring patterns 18 each connected to the second contact 16 or the third contact 17 is formed on the upper surface of the second interlayer insulating layer 19. More specifically, in the process illustrated in FIG. 2F, the second contact 16 is formed to penetrate the second interlayer insulating layer 19 and the stress buffering region layer 105 to extend to the upper electrode layer 104 by the conventional semiconductor process. In addition, the third contact 17 is formed penetrating the second interlayer insulating layer 19, the stress buffering region layer 105, and the first interlayer insulating layer 14 to extend to the source/drain layer 12. Next, the wiring patterns 18 each connected to the second contact 16 or the third contact 17 is formed on the upper surface of the second interlayer insulating layer 19.

As described above, the nonvolatile memory element 1 according to the variation is fabricated. In the nonvolatile memory element 1 according to the variation, the stress buffering region layer 105 composed of porous structure is formed between at least the second interlayer insulating layer 19 and the upper electrode layer 104. Thus, it is possible to reduce the stress applied from the second interlayer insulating layer 19 to the upper electrode layer 104. With this, it is possible to suppress the change in the form (formation of protrusion) of the upper electrode layer 104 due to the stress from the second interlayer insulating layer 19. Thus, it is possible to form the upper electrode layer 104 to be substantially planar.

With this, it is possible to stabilize the form of the variable resistance element 10, thereby implementing the nonvolatile memory element 1 including the variable resistance element 10 having suppressed variation in the initial resistance values. Furthermore, fabricating one nonvolatile memory element 1 using the variable resistance element 10, for example, with one transistor/one variable resistance element stabilizes the operation.

As described above, the nonvolatile memory element 1 according to the variation is fabricated. With this, in the nonvolatile memory element 1 in the variation, it is possible to form the stress buffering region layer 105 with the thickness between approximately 10 nm and 100 nm inclusive between the upper electrode layer 104 and the second interlayer insulating layer 19 uniformly without using a special process. As described above, the nonvolatile memory element 1 according to the variation produces an effect of facilitating fabrication since the micro-process for general semiconductor can be used.

(Embodiment 2)

[Configuration of Nonvolatile Memory Element]

Figure 4A:
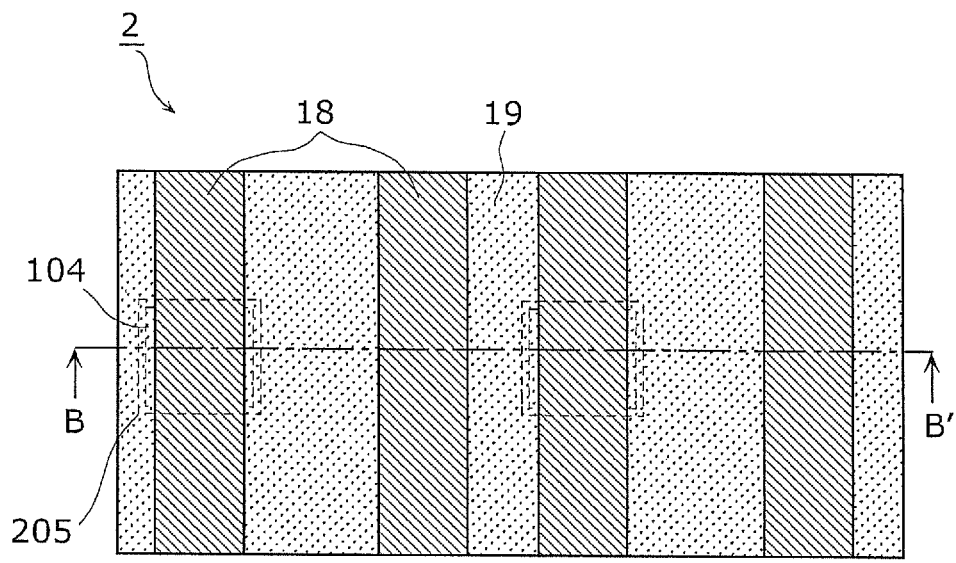
FIG. 4A illustrates a configuration of the nonvolatile memory element according to the embodiment 2 of the present invention.
Figure 4B:
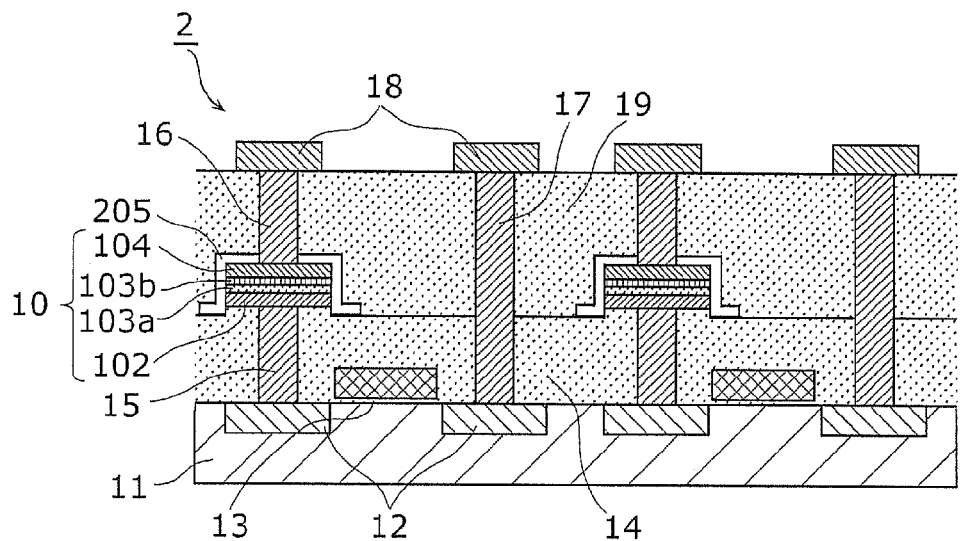
FIG. 4B illustrates a configuration of the nonvolatile memory element according to the embodiment 2 of the present invention.

FIGS. 4A and 4B illustrate a configuration of the nonvolatile memory element according to the embodiment 2 of the present invention. FIG. 4A is a plan view, and FIG. 4B is a cross-sectional view of the line B-B' in FIG. 4A viewed in the direction of the arrows. Note that, FIGS. 4A and 4B illustrate an example in which two nonvolatile memories 2 are included.

The nonvolatile memory element 2 according to the embodiment 2 illustrated in FIG. 4B is different from the nonvolatile memory element 1 according to the embodiment 1 in the configuration of the stress buffering region layer 205. More specifically, in the embodiment 1, the stress buffering region layer 105 is composed of the plasma TEOS film with reduced stress or an insulating layer with porous structure (porous silica, for example). In the embodiment 2, an air layer, that is, an air gap in which there is no insulating layer contacting the upper electrode layer 104 is formed as the stress buffering region layer 205. The rest of the configuration is identical to the nonvolatile memory element 1 according to the embodiment 1. Note that, in FIGS. 4A and 4B, the same reference numerals are assigned to the components identical to FIGS. 1A and 1B, and detailed description for these components is omitted.

In the nonvolatile memory element 2, the air gap (air layer) is formed between the second interlayer insulating layer 19 and the upper electrode layer 104 as the stress buffering region layer 205. With this, the stress from the second interlayer insulating layer 19 is not applied to the upper electrode layer 104.

The nonvolatile memory element 2 with the configuration described above can further prevent the change in the form (formation of protrusion) of the upper electrode layer 104 due to the stress from the second interlayer insulating layer 19 in the variable resistance element 10, compared to the nonvolatile memory element 1 (FIG. 1B) according to the embodiment 1. With this, it is possible for the nonvolatile memory element 2 to further suppress the variation in the resistance values compared to the nonvolatile memory element 1 (FIG. 1B).

[Method of Fabricating Nonvolatile Memory Element]

Next, the fabrication method for the nonvolatile memory element 2 according to the embodiment 2 of the present invention shall be described.

FIGS. 5A to 5E are cross-sectional diagrams illustrating fabrication processes of the nonvolatile memory element 2 according to the embodiment 2 of the present invention. Note that, the same reference numerals are assigned to the components identical to the ones in FIGS. 2A to 2F, and detailed description is omitted.

First, the description for the fabrication method of the nonvolatile memory element 2 according to the embodiment 2 shall be omitted since the processes from FIG. 2A to FIG. 2C illustrating the fabrication method of the nonvolatile memory element 1 according to the embodiment 1 are identical.

Next, in the processes illustrating FIGS. 5A to 5E, a sacrificial layer 205*a* which will be removed later to form the air layer (stress buffering region layer 205) is formed to directly cover the upper surface and the side surfaces of the upper electrode layer 104. Next, the second interlayer insulating layer 19 is formed to cover at least the upper surface and the side surfaces of the upper electrode layer 104 through the sacrificial layer 205*a*. Next, by removing the sacrificial layer 205*a*, the air layer for buffering the stress from the second insulating layer 19 to the upper electrode layer 104 is formed as the stress buffering region layer 205. The second contact 16 is formed in the second opening 16A formed penetrating the second interlayer insulating layer 19 and the stress buffering region layer 205 to extend to the upper electrode layer 104. Here, the stress buffering region layer 205 is formed by first forming the second contact opening 16A and by removing the sacrificial layer 205*a* by etching from the second contact opening 16A.

Figure 5A:
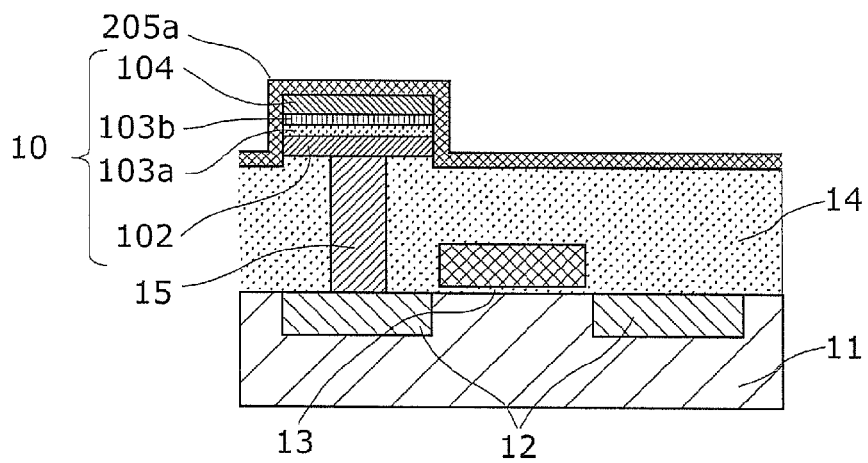
FIG. 5A is a cross-sectional diagram illustrating a fabrication process for the nonvolatile memory element according to the embodiment 2 of the present invention.

More specifically, after the processes illustrated in FIGS. 2A to 2C, in the process illustrated in FIG. 5A, the sacrificial layer 205*a* is deposited to directly cover the first interlayer insulating layer 14, the upper surface and the side surfaces of the upper electrode layer 104, and side surfaces of the second variable resistance layer 103*b*, the first variable resistance layer 103*a*, and the lower electrode layer 102. Here, this sacrificial layer 205*a* is formed by depositing the insulating layer with porous structure having smaller density than the density of the second interlayer insulating layer 19 (porous silica, for example) for 10 nm. Note that, this sacrificial layer 205*a* is not limited to porous silica, and the oxide used for the second interlayer insulating layer 19, for example, the material having a faster we etching rate or etching rate by fluoride vapor gas than the plasma TEOS film may be used.

Figure 5B:
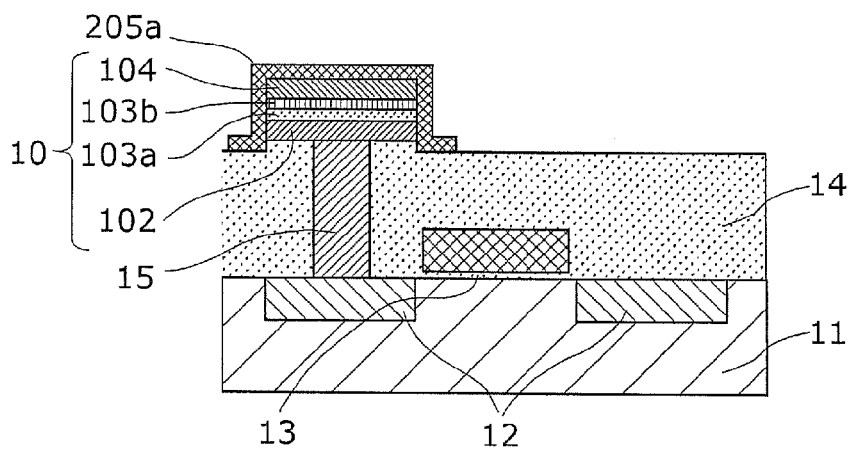
FIG. 5B is a cross-sectional diagram illustrating a fabrication process for the nonvolatile memory element according to the embodiment 2 of the present invention.

Next, in the process illustrated in FIG. 5B, by the regular exposure process, development process, and dry etching process, the sacrificial layer 205*a* is formed in a predetermined pattern larger than the variable resistance element 10 such that a region directly covering the variable resistance element 10 remains.

Figure 5C:
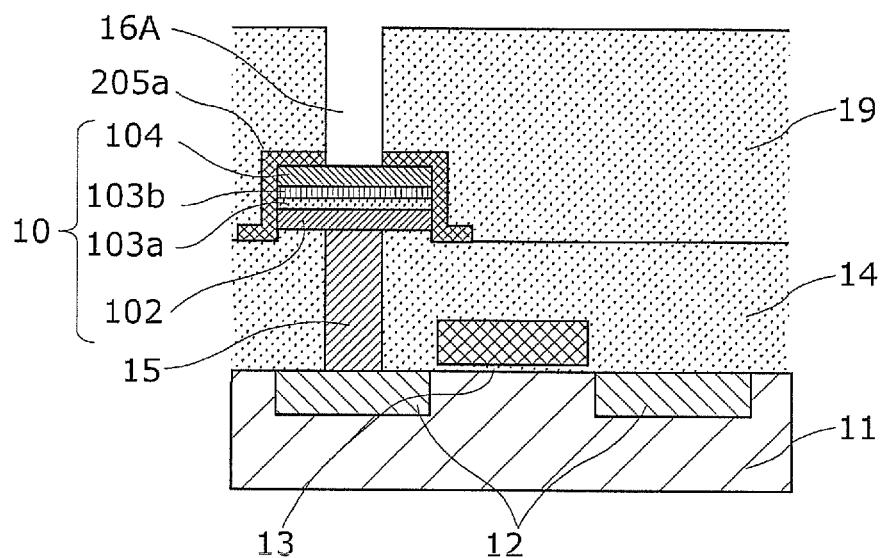
FIG. 5C is a cross-sectional diagram illustrating a fabrication process for the nonvolatile memory element according to the embodiment 2 of the present invention.

Next, in the process illustrated in FIG. 5C, the second interlayer insulating layer 19 is deposited to cover the sacrificial layer 205*a*, and the second contact opening 16A is formed at a predetermined position for forming the second contact 16 in the later process, penetrating the second interlayer insulating layer 19 and the sacrificial layer 205*a* to extend to the upper electrode layer 104.

Figure 5D:
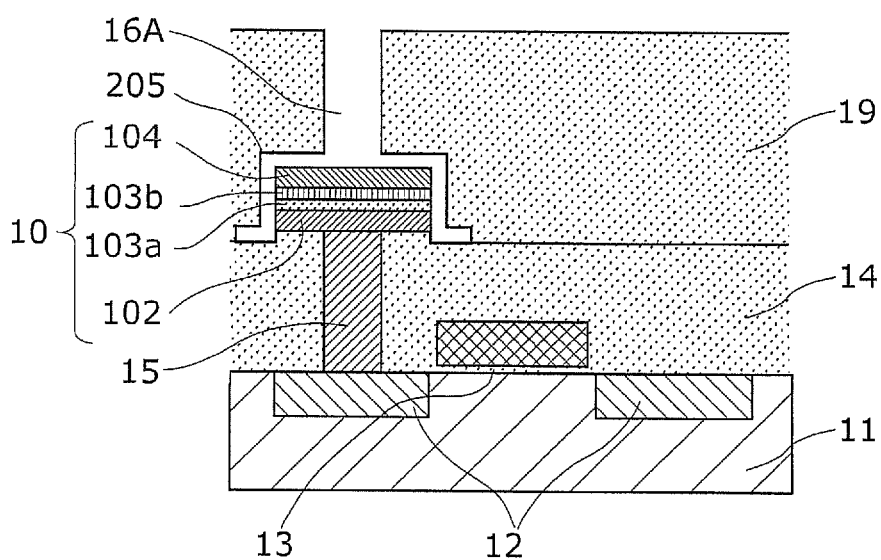
FIG. 5D is a cross-sectional diagram illustrating a fabrication process for the nonvolatile memory element according to the embodiment 2 of the present invention.

Next, in the process illustrated in FIG. 5D, the sacrificial layer 205*a* is removed by etching from the second contact opening 16A. The sacrificial layer 205*a* is exposed through the second contact opening 16A, and thus, it is possible to selectively remove the sacrificial layer 205*a* using the second contact opening 16A by we etching. Note that, the method for removing the sacrificial layer 205*a* is not limited to we etching, and dry etching process using fluoric vapor gas (Vapor HF) may be performed. As described above, at least 10 nm of air gap (air layer) is formed as the stress buffering region layer 205 between the upper electrode layer 104, the first variable resistance layer 103*a*, the second variable resistance layer 103*b*, and the lower electrode layer 102, and the second interlayer insulating layer 19.

Figure 5E:
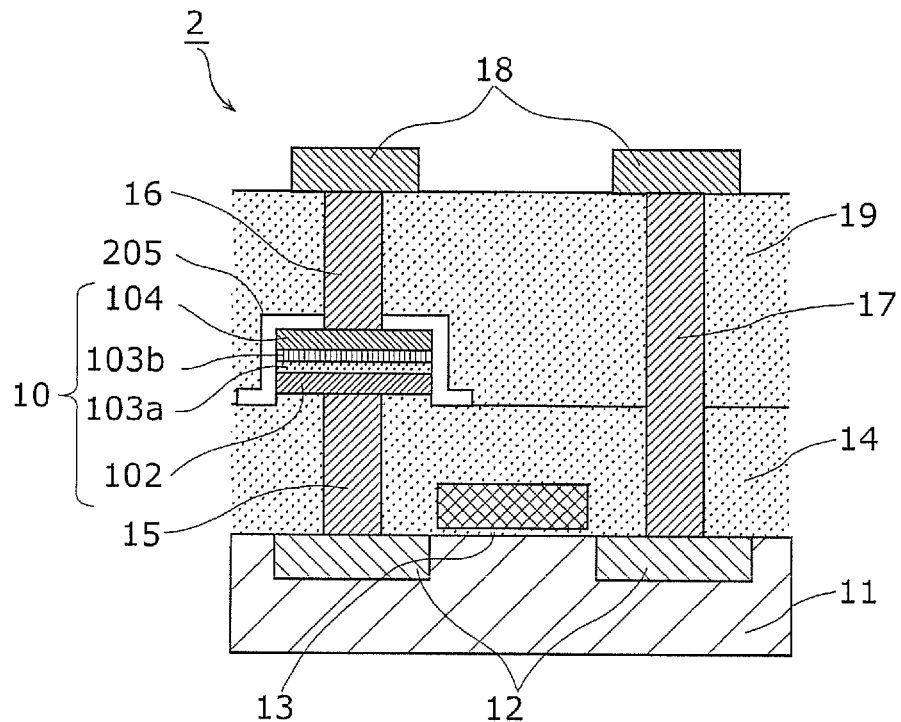
FIG. 5E is a cross-sectional diagram illustrating a fabrication process for the nonvolatile memory element according to the embodiment 2 of the present invention.

Next, in the process illustrated in FIG. 5E, the second contact 16 is formed at the second contact opening 16A. In addition, the third contact 17 penetrating the second interlayer insulating layer 19 and the first interlayer insulating layer 14 and connected to the source/drain layer 12 is formed. Next, the wiring patterns 18 each connected to the second contact 16 or the third contact 17 is formed on the upper surface of the second interlayer insulating layer 19.

The nonvolatile memory element 2 is fabricated as described above.

As described above, in the nonvolatile memory element 2, the air gap as the stress buffering region layer 205 is formed between the second interlayer insulating layer 19 and the upper electrode layer 104. Thus, the stress from the second interlayer insulating layer 19 is not applied to the upper electrode layer 104. Thus, it is possible to prevent the change in form (formation of protrusion) in the upper electrode layer 104 due to the stress from the second interlayer insulating layer 19 to the upper electrode layer 104. With this, it is possible to form the upper electrode layer 104 to be substantially planar.

With this, it is possible to stabilize the form of the variable resistance element 10. Thus, compared to the nonvolatile memory element 1 in the embodiment 1 (FIG. 1B), it is possible to implement the nonvolatile memory element 2 having a variable resistance element 10 with the variation in the resistance values further suppressed. Furthermore, fabricating one nonvolatile memory element 2 using the variable resistance element 10, for example, with one transistor/one variable resistance element can stabilize the operation.

The nonvolatile memory element 2 is fabricated as described above. As described above, the air gap for approximately 10 nm is formed as the stress buffering region layer 205 between the upper electrode layer 104 and the second interlayer insulating layer 19. Thus, the stress from the second interlayer insulating layer 19 is not applied to the upper electrode layer 104. Accordingly, in the nonvolatile memory element 2, it is possible to prevent the change in the form (formation of protrusions), and to form a substantially planar upper electrode layer 104. With this, it is possible to stabilize the form of the variable resistance element 104, thereby implementing the nonvolatile memory element 2 including the variable resistance element 10 having suppressed variation in the resistance values.

(Embodiment 3)

[Configuration of Nonvolatile Memory Element]

Figure 6A:
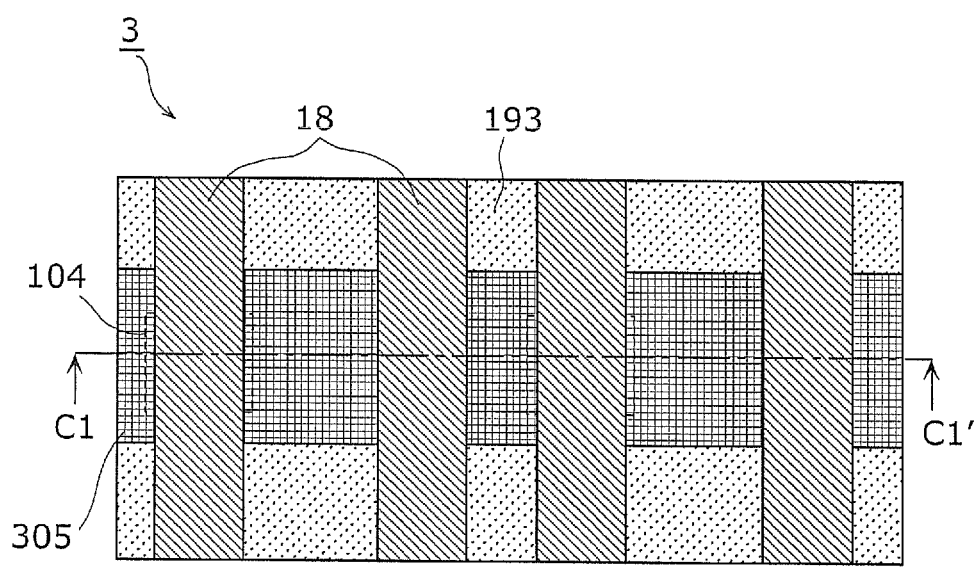
FIG. 6A illustrates a configuration of the nonvolatile memory element according to the embodiment 3 of the present invention.
Figure 6B:
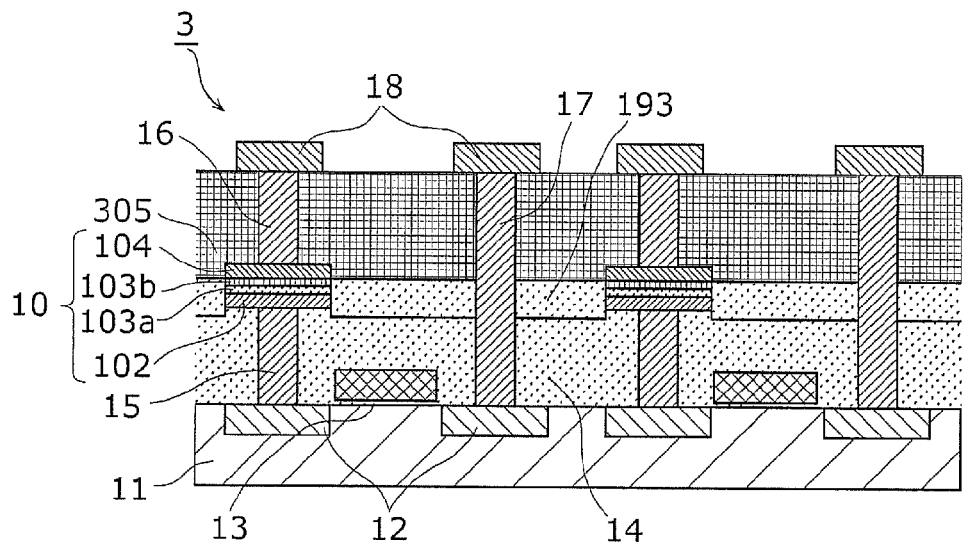
FIG. 6B illustrates a configuration of the nonvolatile memory element according to the embodiment 3 of the present invention.

FIGS. 6A and 6B illustrate a configuration of the nonvolatile memory element according to the embodiment 3 of the present invention. FIG. 6A is a plan view, and FIG. 6B is a cross-sectional view of the line C-C' in FIG. 6A viewed in the direction of the arrows. Note that, FIGS. 6A and 6B illustrate an example in which two nonvolatile memory elements 3 are included.

The nonvolatile memory element 3 according to the embodiment 3 as illustrated in FIG. 6B is different from the nonvolatile memory element 1 in the embodiment 1 in the configuration of the stress buffering region layer 305 and the second interlayer insulating layer 193. More specifically, in the embodiment 1, the stress buffering region layer 105 is formed only between the upper electrode layer 104 and the second interlayer insulating layer 19. In contrast, in the embodiment 2, the stress buffering region layer 305 is formed not only between the upper electrode layer 104 and the second interlayer insulating layer 193, but also between the second contact 16 and the second interlayer insulating layer 193. In other words, in the embodiment 3, the stress buffering region layer 305 is formed to directly cover at least the upper surface and the side surfaces of the upper electrode layer 104 and the side surfaces of the second contact 16. Furthermore, the stress buffering region layer 305 is composed of a plasma TEOS film with reduced stress or the insulating layer with porous structure (porous silica and others). The rest of the configuration is identical to the nonvolatile memory element 1 according to the embodiment 1. Note that, in FIGS. 6A and 6B, the same reference numerals are assigned to the components identical to FIGS. 1A and 1B, and detailed description for these components is omitted.

This nonvolatile memory element 3 is capable of reducing the stress applied from the second interlayer insulating layer 19 to the upper electrode layer 104 generated due to the thermal treatment during the fabrication process since the stress buffering region layer 305 with smaller stress than the stress from the second interlayer insulating layer 193 is formed as illustrated in FIG. 6B. Furthermore, the stress buffering region layer 305 is formed between the second contact 16 connected to the upper electrode layer 104 and the second interlayer insulating layer 193. Thus, it is possible to reduce the stress generated due to the thermal treatment during fabrication and applied from the second interlayer insulating layer 19 to the second contact 16. More specifically, the stress buffering region layer 305 can also reduce the stress applied to the upper electrode layer 104 through the second contact 16.

With this configuration, in the variable resistance element 10, it is possible to further suppress the change in the form of the upper electrode layer 104 due to the stress from the second interlayer insulating layer 19, compared to the nonvolatile memory element 1 according to the embodiment 1 (FIG. 1B). With this, it is possible for the nonvolatile memory element 3 to further suppress the variation in the resistance values compared to the nonvolatile memory element 1 according to the embodiment 1 (FIG. 1B).

[Method of Fabricating Nonvolatile Memory Element]

Next, the fabrication method for the nonvolatile memory element 3 according to the embodiment 3 of the present invention shall be described.

FIGS. 7A to 7E are cross-sectional diagrams illustrating fabrication processes of the nonvolatile memory element 3 according to the embodiment 3 of the present invention. Note that, the same reference numerals are assigned to the components identical to the ones in FIGS. 2A to 2F, and detailed description is omitted.

First, the description for the fabrication method of the nonvolatile memory element 3 according to the embodiment 2 shall be omitted since the processes from FIG. 2A to FIG. 2C illustrating the fabrication method of the nonvolatile memory element 1 according to the embodiment 1 are identical.

Next, in the process illustrated in FIGS. 7A to 7E, an insulating layer with the same material as the second interlayer insulating layer 19 is formed to cover the lower electrode layer 102, the first variable resistance layer 103a, the second variable resistance layer 103b and the upper electrode layer 104. Next, the second interlayer insulating layer 19 is formed by removing the insulating layer comprising the same material as the second interlayer insulating layer 19 by etching so as to expose at least the upper electrode layer 104. In contrast, the stress buffering region layer 305 is subsequently formed to directly cover at least the upper surface and the side surfaces of the upper electrode layer 104 and the side surfaces of the second contact 16 with the insulating layer for buffering the stress from the second interlayer insulating layer 19 to the upper electrode layer 104 and with a stress smaller than the stress of the insulating layer used for the second interlayer insulating layer 19. Furthermore, the second contact 16 is formed penetrating the stress buffering region layer 305 to extend to the upper electrode layer 104.

Figure 7A:
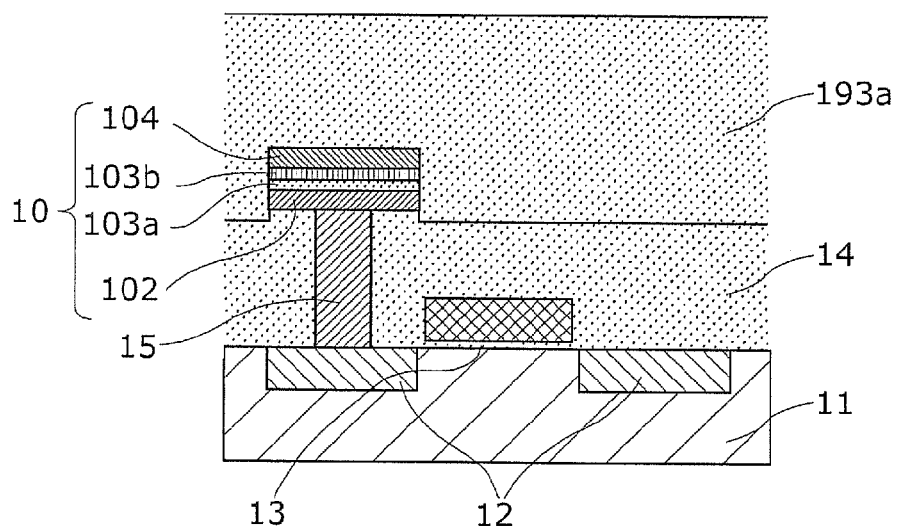
FIG. 7A is a cross-sectional diagram illustrating a fabrication process for the nonvolatile memory element according to the embodiment 3 of the present invention.

More specifically, after the process illustrated in FIGS. 2A to 2C, first, in the process illustrated in FIG. 7A, the second interlayer insulating layer 193 is deposited to cover the first interlayer insulating layer 14, the upper electrode layer 104, the second variable resistance layer 103b, the first variable resistance layer 103a and the lower electrode layer 102.

Figure 7B:
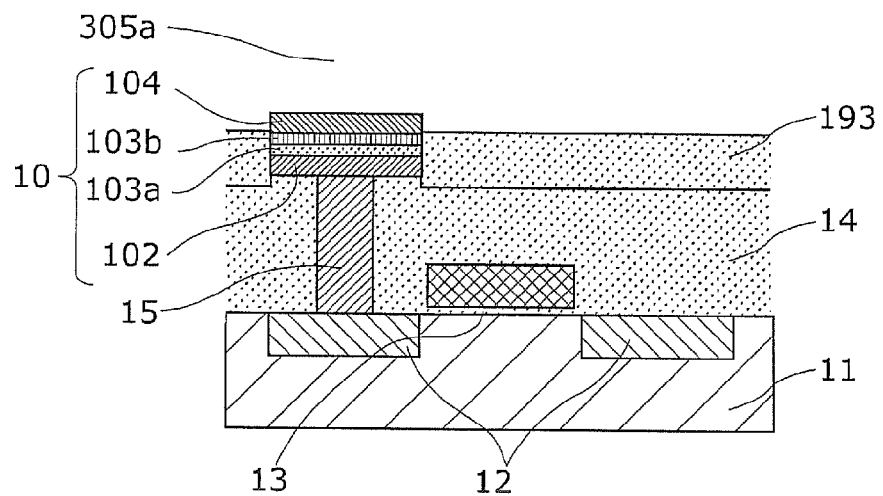
FIG. 7B is a cross-sectional diagram illustrating a process of fabricating the nonvolatile memory element according to the embodiment 3 of the present invention.

Next, in the process illustrated in FIG. 7B, a mask pattern is formed in a predetermined shape of the stress buffering region layer 305 which will be formed later, and a groove-shaped opening 305a is formed such that the upper electrode layer 104 of at least adjacent variable resistance elements 10 by etching process. The we etching process using chemical solution or the dry etching process using fluoric gas may be used as the etching process.

Next, in the process illustrated in FIG. 7C, the insulating layer 305b with porous structure which will serve as the stress buffering region layer 305 is formed in the groove-shaped opening 305a. Here, porous silica with less density and lower stress than the density and the stress of the second interlayer insulating layer 193 is used for the insulating layer 305b with porous structure.

Next, in the process illustrated in FIG. 7D, the second contact 16 penetrating the insulating layer 305b and connected to the upper electrode layer 104 is formed. Furthermore, the third contact 17 penetrating the insulating layer 305b, the second interlayer insulating layer 193 and the first interlayer insulating layer 14 and connected to the source/drain layer 12 is formed. With this, the stress buffering region layer 305 is formed.

Next, in the process illustrated in FIG. 7E, the wiring pattern 18 each connected to the second contact 16 or the third contact 17 is formed on the upper surface of the stress buffering region layer 305.

The nonvolatile memory element 3 is fabricated as described above.

As described above, in the nonvolatile memory element 3, the stress buffering region layer 305 with porous structure having smaller stress than the stress of the second interlayer insulating layer 193 is formed between the second interlayer insulating layer 193 and the upper electrode layer 104. Accordingly, the stress buffering region layer 305 can reduce the stress generated by the thermal treatment during the fabrication from the second interlayer insulating layer 193 to the upper electrode layer 104. Furthermore, the stress buffering region layer 305 is also formed between the second contact 16 connected to the upper electrode layer 104 and the second interlayer insulating layer 193. Thus, the stress buffering region layer 305 reduces the stress generated due to the thermal treatment during fabrication and applied from the second interlayer insulating layer 193 to the second contact 16. More specifically, with the stress buffering region layer 305, the stress from the second interlayer insulating layer 19 to the second contact 16 is reduced, and through the second contact 16, the stress applied from the second interlayer insulating layer 193 to the upper electrode layer 104 is also reduced.

Accordingly, in the nonvolatile memory element 3, the change in the form (formation of protrusion) of the upper electrode layer 104 due to the stress from the second interlayer insulating layer 193 can be further suppressed compared to the configuration according to the embodiment 1 (FIG. 1). With this, it is possible for the nonvolatile memory element 3 to further suppress the variation in the resistance values compared to the nonvolatile memory element 1 according to the embodiment 1 (FIG. 1B).

Furthermore, as described above, it is possible to form the second interlayer insulating layer 193 with a region larger than the variable resistance element 10 by the removal using etching. Thus, it is possible to form the stress buffering region layer 305 with porous structure without using the smallest pattern in the process rule. Accordingly, the stress buffering region layer 305 is suitable for miniaturization because micro process is not necessary. It is possible to fabricate the nonvolatile memory element 3 with stable operation by comprising one nonvolatile storage unit with one transistor/one variable resistance element using the variable resistance element 10.

(Variation)

Note that, as described above, the stress buffering region layer 305 is formed to cover the upper surface and the side surfaces of the upper electrode layer 104 and the second contact 16, at an entire surface above the side surfaces of the upper electrode layer 104. However, it is not limited to this example. The stress buffering region layer 305 may be formed to directly cover a region near the upper portion of the upper electrode layer 104 including the second contact 16. This configuration shall be described as a variation of the embodiment 3 as follows.

Figure 8A:
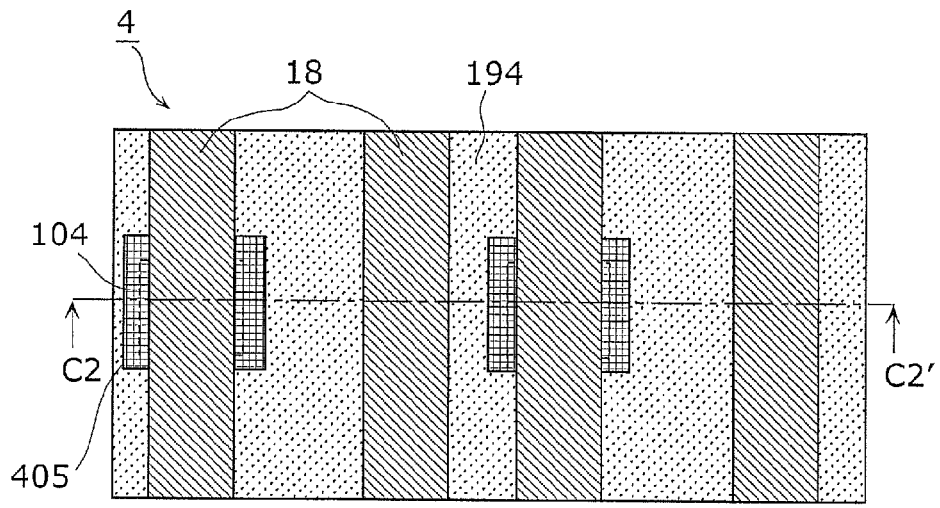
FIG. 8A illustrates a configuration of the nonvolatile memory element according to a variation of the embodiment 3 of the present invention.
Figure 8B:
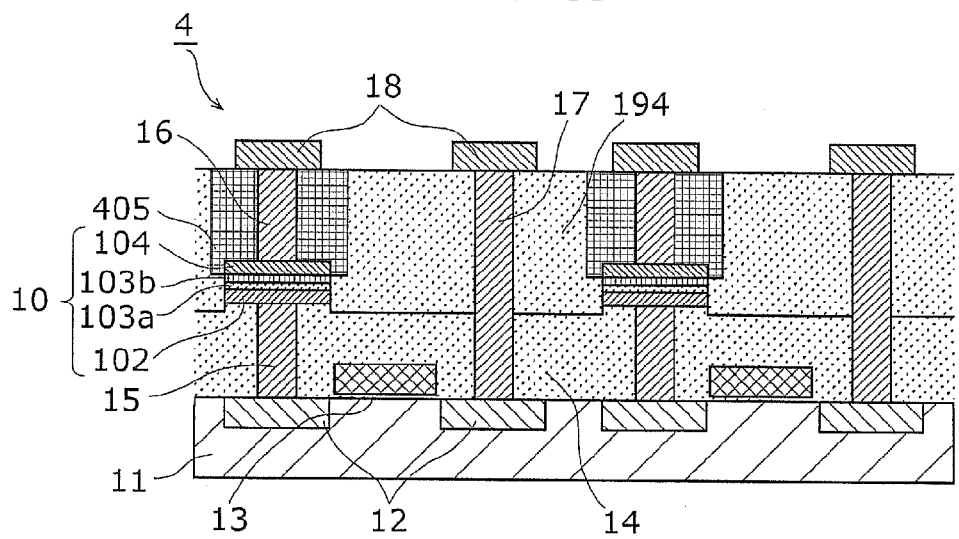
FIG. 8B illustrates a configuration of the nonvolatile memory element according to the variation of the embodiment 3 of the present invention.

FIGS. 8A and 8B illustrate configuration of the nonvolatile memory element according to the variation of the embodiment 3. FIG. 8A is a plan view, and FIG. 8B is a cross-sectional view of the line C2-C2' in FIG. 8B viewed in the direction of the arrows. Note that, FIGS. 8A and 8B illustrate an example in which two nonvolatile memories 4 are included.

As illustrated in FIG. 8B, the nonvolatile memory element 4 according to this variation is different from the nonvolatile memory element 3 according to the embodiment 3 in that the stress buffering region layer 405 is formed in a region in the proximity of the upper portion of each of the variable resistance element 10. The stress buffering region layer 405 is composed of a plasma TEOS film with reduced stress or the insulating layer with porous structure (porous silica and others), in the same manner as the stress buffering region layer 305 described above. The rest of the configuration is identical to the nonvolatile memory element 3. Note that, in FIGS. 8A and 8B, the same reference numerals are assigned to the components identical to FIGS. 6A and 6B, and detailed description for these components is omitted.

As is evident from the comparison between FIG. 8B and FIG. 6B, the nonvolatile memory element 4 with this configuration allows the stress buffering region layer 405 composed of porous structure with lower density and lower mechanical strength than the second interlayer insulating layer 194 to be formed in the smallest area. With this, the nonvolatile memory element 4 produces an effect of improving the mechanical strength compared to the nonvolatile memory element 3 in the embodiment 3.

[Method of Fabricating Nonvolatile Memory Element]

Next, the method of fabricating the nonvolatile memory element 4 according to this variation shall be described.

FIGS. 9A to 9E are cross-sectional diagrams illustrating fabrication processes of the nonvolatile memory element 4 according to the variation of the embodiment 3 of the present invention. Note that, the same reference numerals are assigned to the components identical to the ones in FIGS. 7A to 7F, and detailed description is omitted.

Figure 9A:
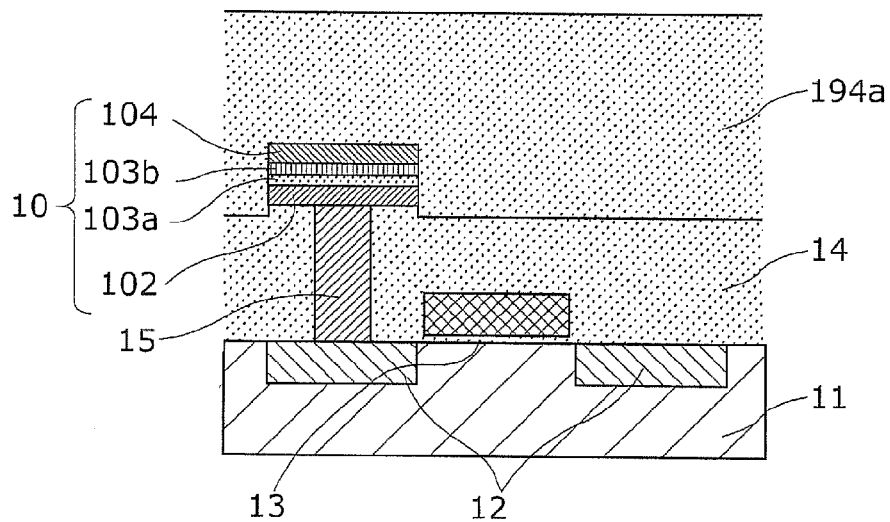
FIG. 9A is a cross-sectional diagram illustrating a fabrication process for the nonvolatile memory element according to the variation of the embodiment 3 of the present invention.
Figure 9B:
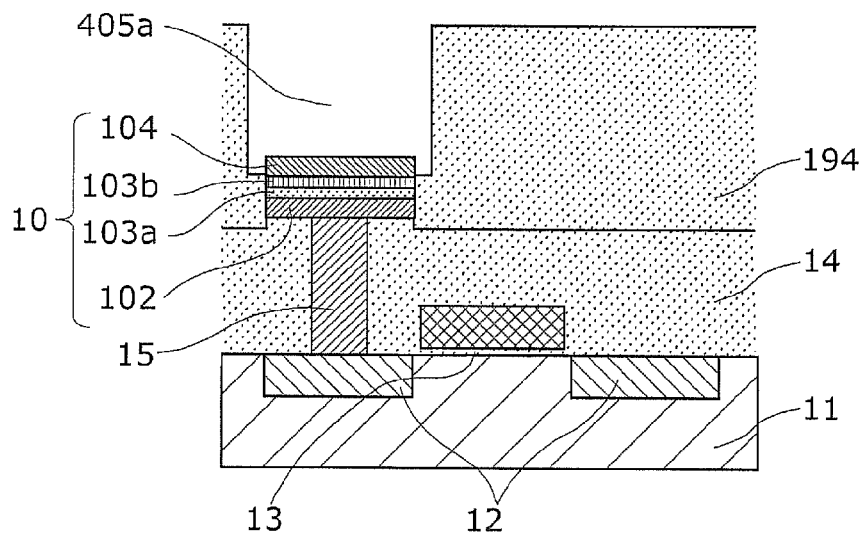
FIG. 9B is a cross-sectional diagram illustrating a fabrication process for the nonvolatile memory element according to the variation of the embodiment 3 of the present invention.
Figure 9C:
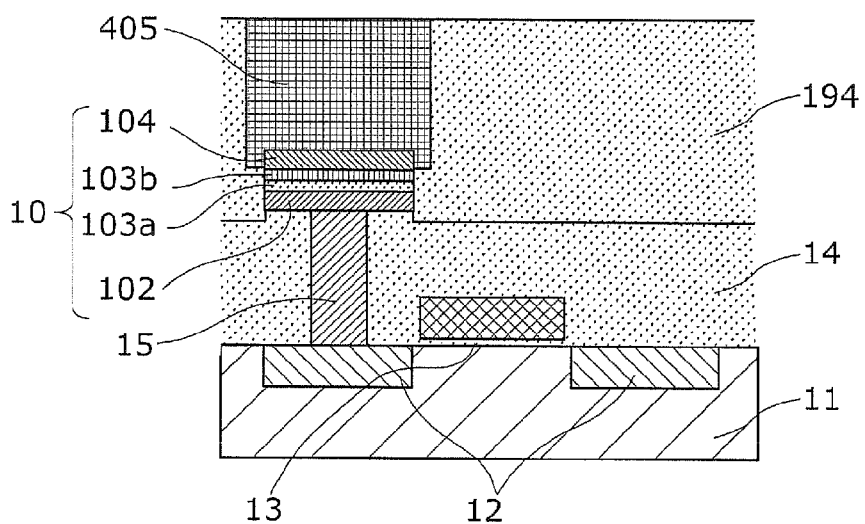
FIG. 9C is a cross-sectional diagram illustrating a fabrication process for the nonvolatile memory element according to the variation of the embodiment 3 of the present invention.

The fabrication method of the nonvolatile memory element 4 according to this variation is different from the fabrication method of the nonvolatile memory element 3 according to the embodiment 3 described above (FIG. 7B), in that the opening 405a in which the stress buffering region layer 405 will be formed later is formed for each variable resistance element 10 in the process illustrated in FIG. 9B.

Figure 9D:
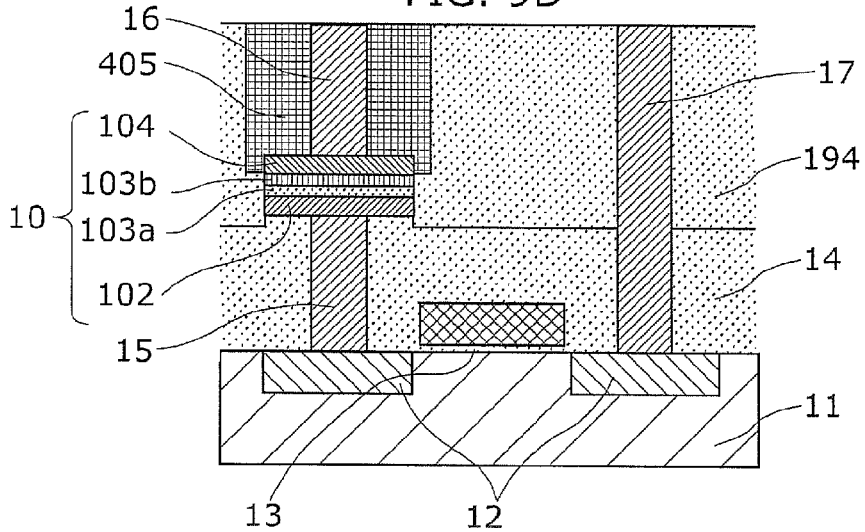
FIG. 9D is a cross-sectional diagram illustrating a fabrication process for the nonvolatile memory element according to the variation of the embodiment 3 of the present invention.
Figure 9E:
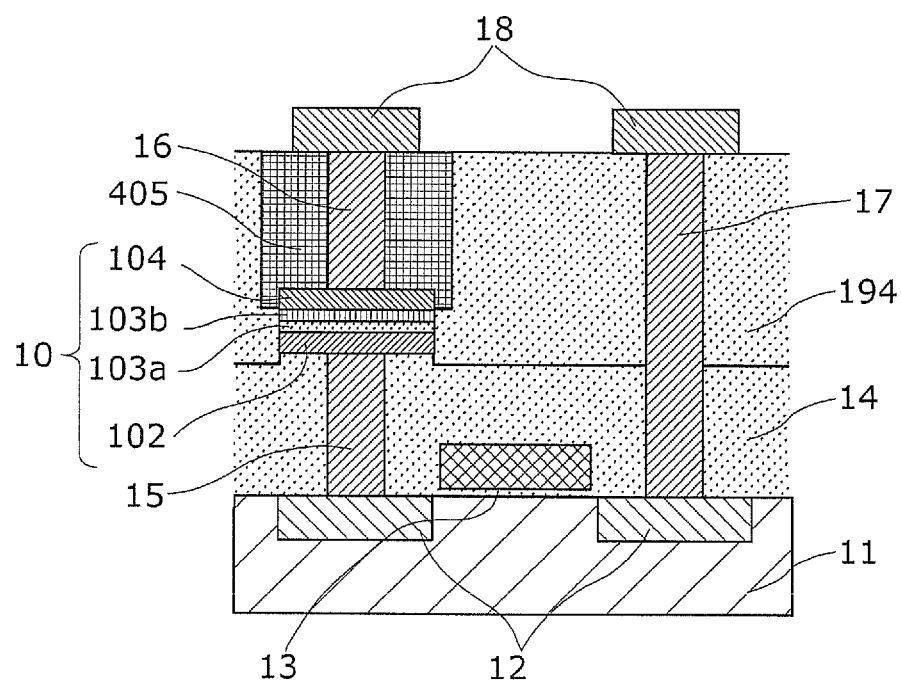
FIG. 9E is a cross-sectional diagram illustrating a fabrication process for the nonvolatile memory element according to the variation of the embodiment 3 of the present invention.

Furthermore, in the process illustrated in FIG. 9D, the second contact 16 penetrating the stress buffering region layer 405 and connected to the upper electrode layer 104 is formed. In addition, the third contact 17 penetrating the second interlayer insulating layer 194 and the first interlayer insulating layer 14 and connected to the source/drain layer 12 is formed. The rest of the configuration is identical to the description of the nonvolatile memory element 4 according to the embodiment 3, and the description shall be omitted.

The nonvolatile memory element 4 is fabricated as described above.

The nonvolatile memory element 4 fabricated as described above produces the effect equivalent to the effect of the nonvolatile memory element 3 according to the embodiment 3. Furthermore, in the nonvolatile memory element 4, the stress buffering region layer 405 can be formed in the smallest area in the nonvolatile memory element 4 using an insulating layer with porous structure and having lower density and lower mechanical strength than the second interlayer insulating layer 194. With this, the nonvolatile memory element 4 produces an effect of improving the mechanical strength compared to the nonvolatile memory element 3 in the embodiment 3. It is possible to fabricate the nonvolatile memory element 4 with stable operation by comprising one nonvolatile storage unit with one transistor/one variable resistance element using the variable resistance element 10 as well.

(Embodiment 4)
[Nonvolatile Memory Element]

Figure 10A:
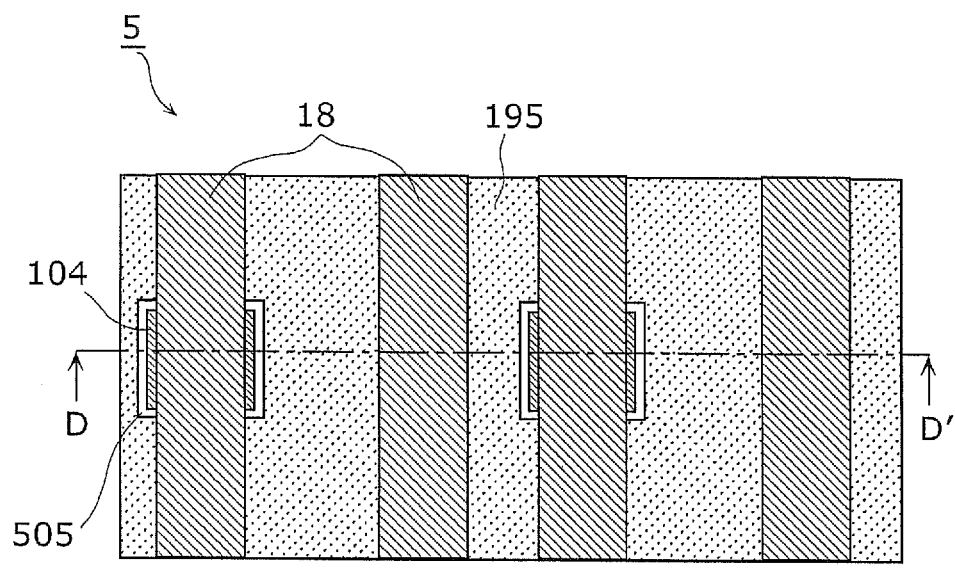
FIG. 10A illustrates the configuration of the nonvolatile memory element according to the embodiment 4 of the present invention.
Figure 10B:
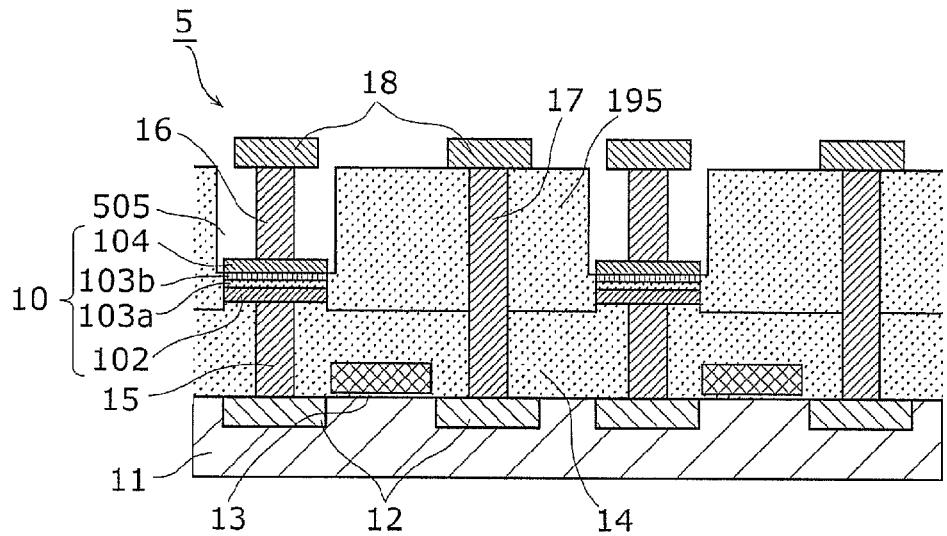
FIG. 10B illustrates the configuration of the nonvolatile memory element according to the embodiment 4 of the present invention.

FIGS. 10A and 10B illustrate a configuration of the nonvolatile memory element according to the embodiment 4 of the present invention. FIG. 10A is a plan view, and FIG. 10B is a cross-sectional view of the major portions along line D-D' in FIG. 10A viewed in the direction of arrows. Note that, FIGS. 10A and 10B illustrate an example in which two nonvolatile memory element 5 are included.

The nonvolatile memory element 5 according to the embodiment 4 illustrated in FIG. 10B is different from the nonvolatile memory element 2 according to the embodiment 2 in that the configuration of the stress buffering region layer 405 and the second interlayer insulating layer 195 is different.

More specifically, as illustrated in FIGS. 10A and 10B, in the embodiment 2, an air layer (air gap) is formed between the upper electrode layer 104 and the second interlayer insulating layer 19 as the stress buffering region layer 205. In contrast, in the embodiment 4, not only the air layer as the stress buffering region layer 505 is formed between the upper electrode layer 104 and the second interlayer insulating layer 195, but also between the second contact 16 and the second interlayer insulating layer 195. The rest of the configuration is identical to the nonvolatile memory 2 according to the embodiment 2. Note that, in FIGS. 10A and 10B, the same reference numerals are assigned to the components identical to the components in FIGS. 4A and 4B, and detailed description is omitted.

In the nonvolatile memory element 5, the air layer (air gap) is formed between the second interlayer insulating layer 195 and the upper electrode layer 104 as the stress buffering region layer 505. With this, the stress from the second interlayer insulating layer 19 is not applied to the upper electrode layer 104. Furthermore, in the nonvolatile memory element 5, an air layer (air gap) is further formed between the second contact 16 connected to the upper electrode layer 104 and the second interlayer insulating layer 195. In other words, in the nonvolatile memory element 5, with the stress buffering region layer 505, the stress is not applied from the second interlayer insulating layer 195 to the second contact 16 either. Thus, it is possible to prevent the stress from the second interlayer insulating layer 195 to the upper electrode layer 104 through the second contact 16. As described above, in the nonvolatile memory element 5, it is possible to completely prevent the stress on the upper electrode layer 104 from the second interlayer insulating layer 19.

With this configuration, in the variable resistance element 10, it is possible to further suppress the change in the form (formation of protrusion) of the upper electrode layer 104 due to the stress from the second interlayer insulating layer 195, compared to the nonvolatile memory 2 according to the embodiment 2 (FIG. 4B). With this, it is possible for the nonvolatile memory 5 to further suppress the variation in the resistance values compared to the nonvolatile memory 2 according to the embodiment 2 (FIG. 4B).

[Method of Fabricating Nonvolatile Memory Element]

Next, the fabrication method for the nonvolatile memory 5 according to the embodiment 4 of the present invention shall be described.

FIGS. 11A to 11D are cross-sectional diagrams illustrating fabrication processes of the nonvolatile memory 5 according to the embodiment 4 of the present invention. Note that, the same reference numerals are assigned to the components identical to the ones in FIGS. 4A to 4F, and detailed description is omitted.

First, the description for the fabrication method of the nonvolatile memory element 5 according to the embodiment 4 shall be omitted since the processes from FIG. 2A to FIG. 2C illustrating the fabrication method of the nonvolatile memory 1 according to the embodiment 1 are identical.

Next, in the process illustrated in FIGS. 11A to 11D, the insulating layer with the same material as the second interlayer insulating layer 195 is formed to cover the upper electrode layer 104, the first variable resistance layer 103a, the second variable resistance layer 103b and the lower electrode layer 102. Next, the insulating layer comprising the same material as the second interlayer insulating layer 195 is removed by etching, and at least the upper electrode layer 104 is removed. With this, the second interlayer insulating layer 195 is formed and an air layer for buffering the stress on the second interlayer insulating layer 195 is formed as the stress buffering region layer 505. The second contact is formed penetrating the stress buffering region layer 505 and the second interlayer insulating layer 195 to extend to the upper electrode layer 104.

Figure 11A:
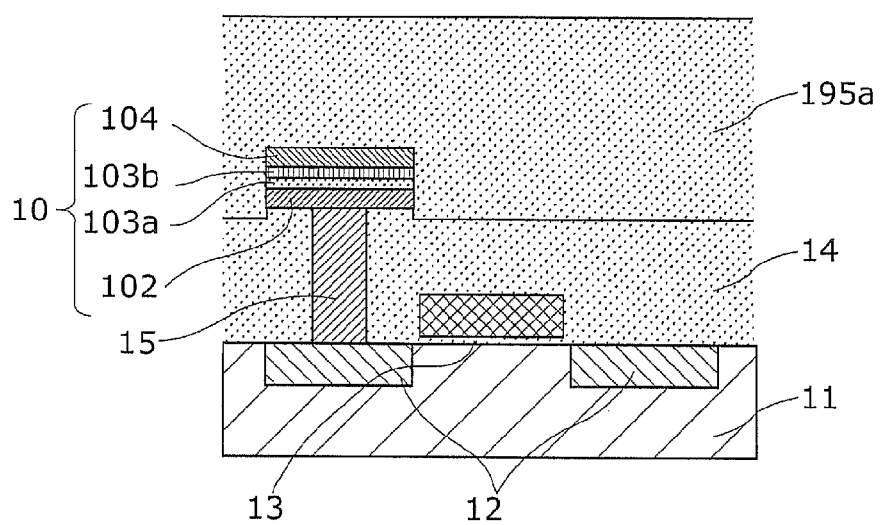
FIG. 11A is a cross-sectional diagram illustrating a fabrication process for the nonvolatile memory element according to the embodiment 4 of the present invention.

More specifically, in the process illustrated in FIG. 11A, the second interlayer insulating layer 195 is deposited to cover an area above the first interlayer insulating layer 14, the upper electrode layer 104, the second variable resistance layer 103b, the first variable resistance layer 103a and the lower electrode layer 102.

Figure 11B:
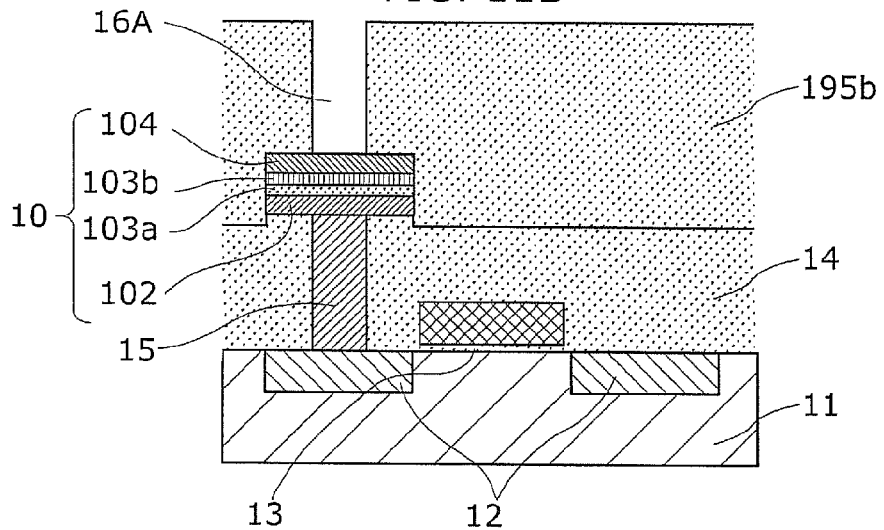
FIG. 11B is a cross-sectional diagram illustrating a fabrication process for the nonvolatile memory element according to the embodiment 4 of the present invention.

Next, in the process illustrated in FIG. 11B, the second contact opening 16A is formed penetrating the second interlayer insulating layer 195 to extend to the upper electrode layer 104 at a predetermined position for forming the second contact 16 in the later process.

Figure 11C:
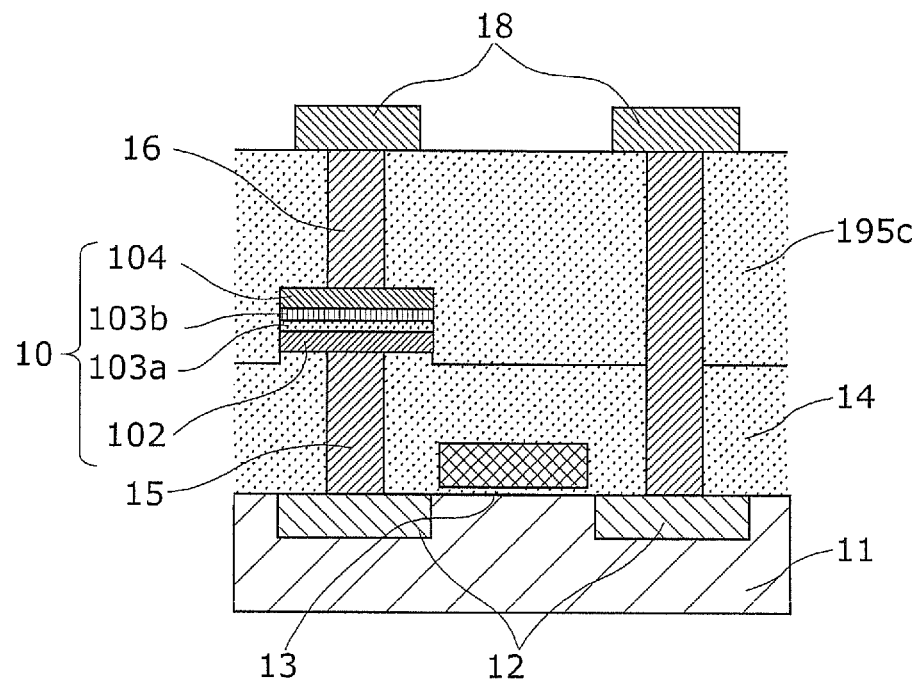
FIG. 11C is a cross-sectional diagram illustrating a fabrication process for the nonvolatile memory element according to the embodiment 4 of the present invention.

Next, in the process illustrated in FIG. 11C, the second contact 16 is formed at the second contact opening 16A. In addition, the third contact 17 penetrating the second interlayer insulating layer 195 and the first interlayer insulating layer 14 and connected to the source/drain layer 12 is formed. Next, the wiring pattern 18 connected to the second contact 16 or the third contact 17 is formed on the upper surface of the second interlayer insulating layer 195.

Figure 11D:
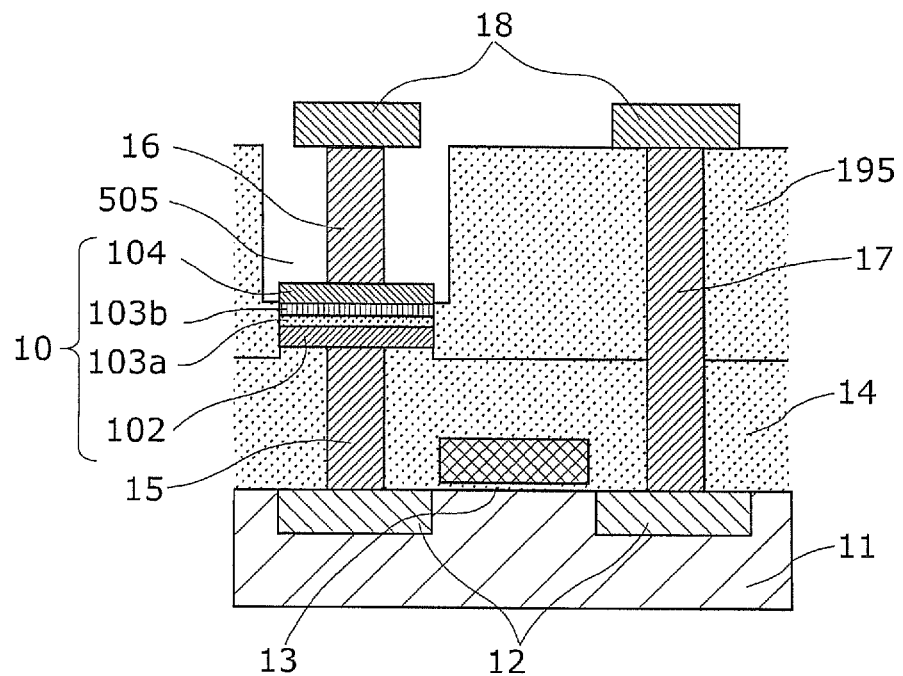
FIG. 11D is a cross-sectional diagram illustrating a fabrication process for the nonvolatile memory element according to the embodiment 4 of the present invention.
Figure 12A:
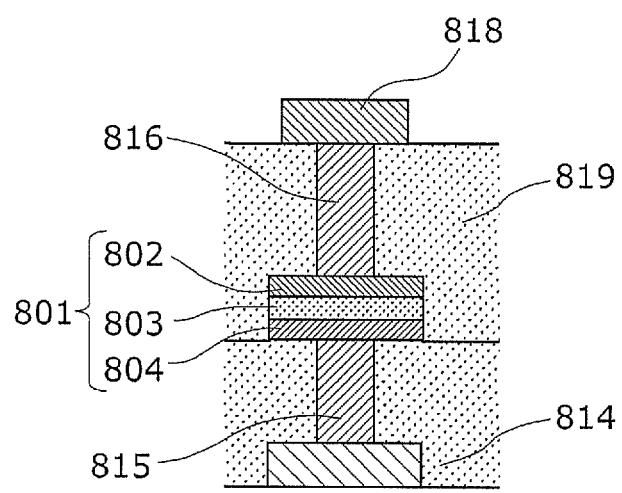
FIG. 12A is a cross-sectional diagram illustrating the major part of the configuration of the nonvolatile memory element according to the conventional example.
Figure 12B:
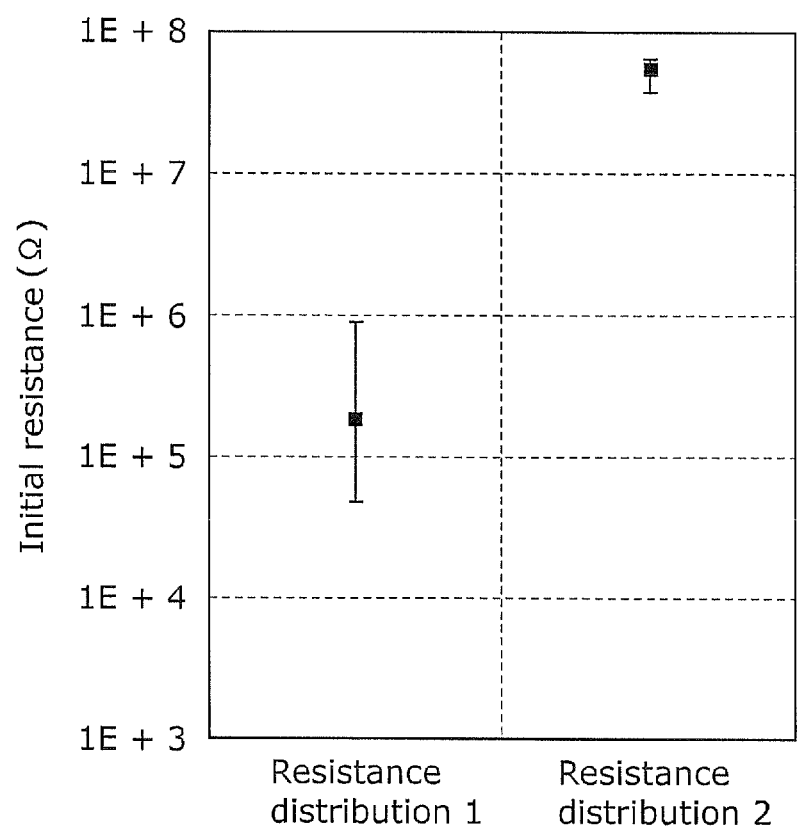
FIG. 12B illustrates the resistance distribution of the nonvolatile memory element according to the conventional example illustrated in FIG. 12A.
Figure 13:
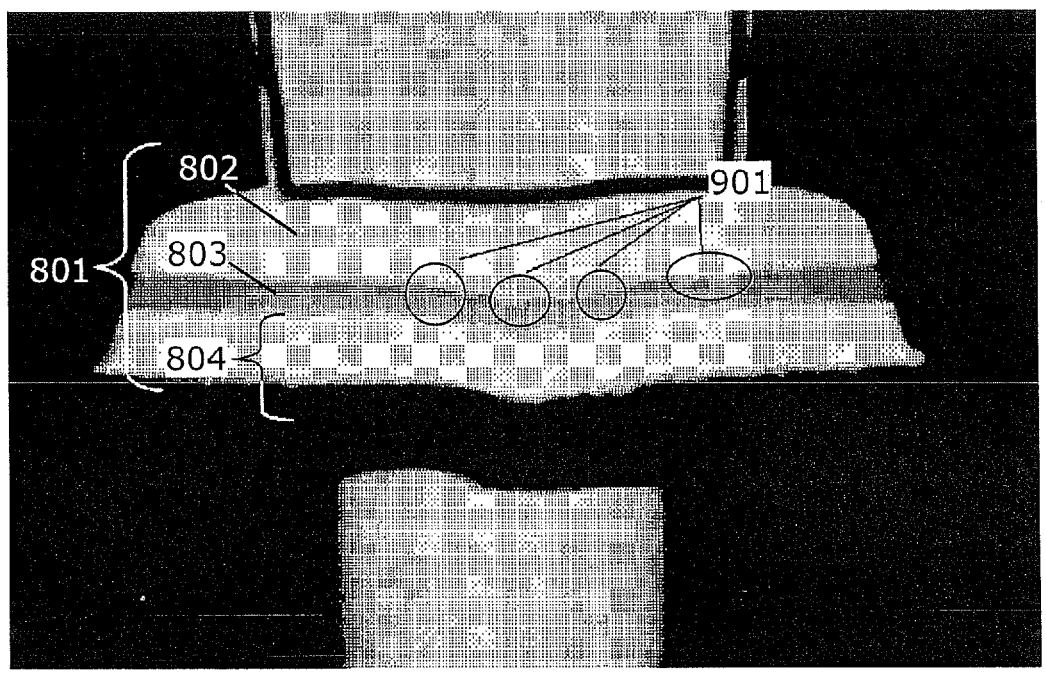
FIG. 13 illustrates a cross-sectional TEM image of the nonvolatile memory element according to the conventional example.

Next, in the process illustrated in FIG. 11D, a mask pattern is formed in a predetermined shape, and the air layer (air gap) which is to be the stress buffering region layer 505 is formed at least until the upper electrode layer 104 and the second contact 16 are exposed by the etching process. Here, the we etching process using chemical solution, dry etching using fluoric gas, or a treatment using fluoric vapor gas (Vapor HF) may be used as the etching process.

The nonvolatile memory 5 is fabricated as described above.

As described above, in the nonvolatile memory 5, an air layer (air gap) of approximately 50 nm is formed between the second interlayer insulating layer 195 and the upper electrode layer 104 as the stress buffering region layer 505. Thus, the stress from the second insulating layer 195 generated by the thermal treatment during the fabrication process is not applied to the upper electrode layer 104. Furthermore, in the nonvolatile memory element 5, an air layer (air gap) is formed as the stress buffering region layer 505 between the second contact 16 connected to the upper electrode layer 104 and the second interlayer insulating layer 195. With this, the stress from the second interlayer insulating layer 195 to the second contact 16 due to thermal treatment during the fabrication process is not applied. Accordingly, there is no stress applied on the upper electrode layer 104 from the second interlayer insulating layer 195 through the second contact 16.

Accordingly, in the nonvolatile memory element 5, it is possible to prevent the change in the form (formation of protrusion) in the upper electrode layer 104 due to the stress from the second interlayer insulating layer 19 further, compared to the nonvolatile memory element 2 according to the embodiment 2 (FIG. 4B).

With this, it is possible to stabilize the form of the variable resistance element 10. Thus, compared to the nonvolatile memory element 2 in the embodiment 2 (FIG. 4B), it is possible to implement the nonvolatile memory element 2 having a variable resistance element 10 with the variation in the resistance values further suppressed. It is possible to fabricate the nonvolatile memory element 5 with stable operation by fabricating the nonvolatile memory comprising one nonvolatile storage unit with one transistor/one variable resistance element, using the variable resistance element 10.

As described above, according to the present invention, it is possible to implement variable resistance nonvolatile memory element capable of suppressing the variation in the resistance values. More specifically, at least the stress applied from the interlayer insulating layer to the upper electrode layer by the thermal treatment is buffered by the stress buffering region layer at least directly covering the upper surface and the side surfaces of the upper electrode layer. Thus, it is possible to reduce the stress from the interlayer insulating layer applied to the upper electrode layer. With this, it is possible to suppress the change in the form (formation of protrusion) of the upper electrode layer due to the migration, and to implement a high-quality nonvolatile memory without variation in the initial operation and operation characteristics of the resistance values.

Although some exemplary embodiments of the nonvolatile memory element according to the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The nonvolatile memory element according to the present invention is useful for various electric devices such as digital home appliances, memory cards, mobile phones, personal computers, and others. The fabrication method for the nonvolatile memory element is useful for the fabrication method for the nonvolatile memory element which can be used for various electric devices such as digital home appliances, memory cards, mobile phones, and personal computers.

REFERENCE SIGNS LIST 1, 2, 3, 4, Nonvolatile memory element
10 Variable resistance element
11 Silicon substrate
12 Source/drain layer
13 Gate layer
14 First interlayer insulating layer
15 First contact
16 Second contact
16A Second contact opening
17 Third contact
18 Wiring pattern
19, 193, 194, 195 Second interlayer insulating layer
102 Lower electrode layer
103a First variable resistance layer
103b Second variable resistance layer
104 Upper electrode layer
105, 205, 305, 405, 505 Stress buffering region layer
105a, 305a, 405a Opening
801 Variable resistance element
802 Upper electrode
803 Variable resistance layer
804 Lower electrode
814, 818 Line
815, 816 Contact
819 Interlayer insulating layer
901 Protrusion

The invention claimed is:

1. A nonvolatile memory element comprising:
a substrate;
a lower electrode layer formed on said substrate;
a first variable resistance layer formed on said lower electrode layer and comprising a metal oxide;
a second variable resistance layer formed on said first variable resistance layer and comprising a metal oxide having smaller oxygen deficiency than oxygen deficiency of said first variable resistance layer;
an upper electrode layer formed on said second variable resistance layer;
an interlayer insulating layer formed to cover at least side surfaces of said lower electrode layer, said first variable resistance layer, and said second variable resistance layer;
a stress buffering region layer for buffering a stress on said upper electrode layer, said stress buffering region layer being formed to directly cover at least an upper surface and side surfaces of said upper electrode layer and having a stress smaller than a stress of an insulating layer used as said interlayer insulating layer;
a contact extending to said upper electrode layer; and
a wiring pattern connected to said contact, and
said stress buffering region layer is an insulating layer having porous structure.

2. The nonvolatile memory element according to claim 1, wherein said interlayer insulating layer is formed to cover at least the upper surface and the side surfaces of said upper electrode layer via said stress buffering region layer,
said contact is formed to penetrate said interlayer insulating layer and said stress buffering region layer, extending up to said upper electrode layer, and
said stress buffering region layer is provided between said upper electrode layer and said interlayer insulating layer to directly cover at least the upper surface and the side surfaces of said upper electrode layer, and buffers the stress on said upper electrode layer from said interlayer insulating layer.

3. The nonvolatile memory element according to claim 1, wherein said stress buffering region layer is provided to directly cover at least the upper surface and the side surfaces of said upper electrode layer, and side surfaces of said contact.

4. The nonvolatile memory element according to claim 1, wherein said upper electrode layer comprises a platinum group element or an alloy including a platinum group element.

5. The nonvolatile memory element according to claim 4, wherein the platinum group element is platinum or palladium.

6. The nonvolatile memory element according to claim 1, wherein the metal oxide comprises a tantalum oxide $TaO_x$, where $0<x<2.5$.

7. The nonvolatile memory element according to claim 1, wherein the metal oxide comprises a tantalum oxide, said first variable layer represented as $TaO_x$ and said second variable resistance layer represented as $TaO_y$ satisfy $0.8 \leq x \leq 1.9$, and $2.1 \leq y < 2.5$.

8. A nonvolatile memory element comprising:
a substrate;
a lower electrode layer formed on said substrate;
a first variable resistance layer formed on said lower electrode layer and comprising a metal oxide;
a second variable resistance layer formed on said first variable resistance layer and comprising a metal oxide having smaller oxygen deficiency than oxygen deficiency of said first variable resistance layer;
an upper electrode layer formed on said second variable resistance layer;
an interlayer insulating layer formed to cover at least side surfaces of said lower electrode layer, said first variable resistance layer, and said second variable resistance layer;
a stress buffering region layer for buffering a stress on said upper electrode layer, said stress buffering region layer being formed to directly cover at least an upper surface and side surfaces of said upper electrode layer and having a stress smaller than a stress of an insulating layer used as said interlayer insulating layer;
a contact extending to said upper electrode layer; and
a wiring pattern connected to said contact, and
said stress buffering region layer is an air layer.

9. The nonvolatile memory element according to claim 8, wherein said interlayer insulating layer is formed to cover at least the upper surface and the side surfaces of said upper electrode layer via said stress buffering region layer,
said contact is formed to penetrate said interlayer insulating layer and said stress buffering region layer, extending up to said upper electrode layer, and
said stress buffering region layer is provided between said upper electrode layer and said interlayer insulating layer to directly cover at least the upper surface and the side surfaces of said upper electrode layer, and buffers the stress on said upper electrode layer from said interlayer insulating layer.

10. The nonvolatile memory element according to claim 8, wherein said stress buffering region layer is provided to directly cover at least the upper surface and the side surfaces of said upper electrode layer, and side surfaces of said contact.

11. The nonvolatile memory element according to claim 8, wherein said upper electrode layer comprises a platinum group element or an alloy including a platinum group element.

12. The nonvolatile memory element according to claim 11, wherein the platinum group element is platinum or palladium.

13. The nonvolatile memory element according to claim 8, wherein the metal oxide comprises a tantalum oxide $TaO_x$, where $0<x<2.5$.

14. The nonvolatile memory element according to claim 8, wherein the metal oxide comprises a tantalum oxide, said first variable layer represented as $TaO_x$ and said second variable resistance layer represented as $TaO_y$ satisfy $0.8 \leq x \leq 1.9$, and $2.1 \leq y < 2.5$.

* * * * *